(12) United States Patent
Knowlton et al.

(10) Patent No.: US 9,455,066 B2
(45) Date of Patent: Sep. 27, 2016

(54) DIELECTRIC HEAT-TRANSFER FLUID

(71) Applicant: E I DU PONT DE NEMOURS AND COMPANY, Wilmington, DE (US)

(72) Inventors: Susan Knowlton, Elkton, MD (US); Serge Rebouillat, Echenevex (FR)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/926,399

(22) Filed: Oct. 29, 2015

(65) Prior Publication Data

US 2016/0049219 A1 Feb. 18, 2016

Related U.S. Application Data

(60) Division of application No. 13/961,210, filed on Aug. 7, 2013, now Pat. No. 9,185,826, which is a continuation of application No. 12/748,891, filed on Mar. 29, 2010, now abandoned.

(60) Provisional application No. 61/164,074, filed on Mar. 27, 2009.

(51) Int. Cl.
*C09K 5/10* (2006.01)
*H01B 3/20* (2006.01)
*H05K 7/20* (2006.01)

(52) U.S. Cl.
CPC . *H01B 3/20* (2013.01); *C09K 5/10* (2013.01); *H05K 7/20218* (2013.01); *Y10T 442/2861* (2015.04)

(58) Field of Classification Search
None
See application file for complete search history.

(56) References Cited

U.S. PATENT DOCUMENTS

| | | |
|---|---|---|
| 4,945,050 A | 7/1990 | Sanford et al. |
| 5,981,781 A | 11/1999 | Knowlton |
| 6,905,638 B2 | 6/2005 | Corkran et al. |
| 7,048,875 B2 | 5/2006 | Oommen et al. |
| 2002/0049145 A1 | 4/2002 | Cannon et al. |
| 2003/0226166 A1 | 12/2003 | Falco et al. |
| 2004/0089855 A1 | 5/2004 | Oommen et al. |
| 2005/0072964 A1 | 4/2005 | Rapp et al. |
| 2006/0226166 A1 | 10/2006 | Hartelius |

FOREIGN PATENT DOCUMENTS

| | | |
|---|---|---|
| FR | 2688146 | 9/1993 |
| WO | WO 94/11516 | 5/1994 |
| WO | WO 03/091370 | 11/2003 |
| WO | WO 03/093403 | 11/2003 |
| WO | WO 2008/113866 | 9/2008 |

OTHER PUBLICATIONS

Hiromi Yoshida, Nobuhisa Hirooka, Goro Kajimoto "Microwave Energy Effects on Quality of Some Seed Oils" Journal of Food Science, vol. 55 No. 5, 1990, p. 1412-1416.

*Primary Examiner* — Necholus Ogden, Jr.

(57) ABSTRACT

Provided is a use of a vegetable oil high in monounsaturates as dielectric and heat-transfer fluid in a device for the generation, storage, conversion and/or distribution of electrical energy.

24 Claims, 13 Drawing Sheets

DIELECTRIC HEAT-TRANSFER FLUID

This application is a Divisional of U.S. application Ser. No. 13/961,210, filed Aug. 7, 2013, now Allowed, which is a Continuation of U.S. application Ser. No. 12/748,891, filed Mar. 29, 2010, now abandoned, which claims the benefit of U.S. Provisional Application No. 61/164,074, filed Mar. 27, 2009, the entire content which is hereby incorporated by reference.

FIELD OF THE INVENTION

The present invention relates to the field of dielectric heat-transfer fluids, in particular dielectric fluid made from vegetable oils for use in, e.g. liquid filled transformers.

BACKGROUND OF THE INVENTION

Electrical transformers typically have windings of conducting wire which must be separated by a dielectric (i.e. non-conducting) material. Usually the coils and dielectric material are immersed in a fluid dielectric heat transfer medium to insulate the conductor and to dissipate heat generated during operation. The heat-transfer medium must act as a dielectric as well. In a typical arrangement, cellulosic and/or aramid paper or board is used as the dielectric material. The cellulosic/aramid material is wrapped around the conducting wire, and used to separate the windings dielectrically, and may also be used as a structural support for the windings or other elements such as the cores. The fluid heat-transfer medium is typically an oil, which may be, for example mineral oil or a sufficiently robust vegetable oil.

During use of the transformer, the dielectric material and heat-transfer fluid are subjected to significant electromagnetic fields and significant variations of temperature and power surges and breakdowns. Over time, the relatively extreme conditions can lead to failure of the dielectric material and deterioration of the heat-transfer fluid. Deterioration leads to power loss due to dielectric loss, and may eventually lead to discharges and catastrophic failure of the transformer causing major pollution and/or fires. The dielectric and heat-transfer fluid can furthermore be directly and indirectly degraded by oxygen migration and water formation or ingression in the transformer.

Mineral oil generally shows excellent dielectric and heat-transfer behaviour, however, dielectric heat-transfer fluids are used in enormous quantities, (i.e. several hundreds of thousands of metric tons per year). The public becomes increasingly sensitive to environment and safety concerns around transformer units, and they are therefore subject to more and more stringent regulations. Many heat-transfer fluids currently used (such as mineral oil) pose a serious concern since they are flammable and do not biodegrade within reasonable time frame or simply not at all. Fluids coming from "bio" (i.e. living) sources are increasingly being seen as future fluids for those purposes. For example, U.S. Pat. Nos. 6,905,638 and 7,048,875 disclose transformers using vegetable oils as the heat-transfer fluid. The vegetable oil may contain chemically synthesised anti-oxidants.

A need remains for improved bio-degradable heat-transfer fluids, which are not limited to food grade oils, showing good performance over time.

SUMMARY OF THE INVENTION

In a first aspect, the invention provides a use of a soy oil as a heat-transfer dielectric fluid in a device to generate, store, convert and/or distribute electrical energy, wherein the soy oil is one in which at least 70%, preferably at least 75% of the fatty acids are $C_{14}$ to $C_{22}$ mono-unsaturated, and less than 16%, preferably less than 7%, more preferably less than 6% of the fatty acids are polyunsaturated.

In a second aspect, the invention provides a device to generate, store, convert and/or distribute electrical energy and/or optical signals, comprising:
(a) a conducting material;
(b) a dielectric material; and
(c) a heat-transfer dielectric fluid, which is a soy oil in which at least 70%, preferably at least 75% of the fatty acids are $C_{14}$ to $C_{22}$ mono-unsaturated, and less than 16%, preferably less than 7%, more preferably less than 6% of the fatty acids are polyunsaturated.

In a third aspect, the invention provides a method for preconditioning a heat-transfer dielectric fluid which is a vegetable triacylglycerol, comprising the step:
(a) exposing said fluid to a constant and uniformly distributed electromagnetic field.

In a fourth aspect, the invention provides a dielectric material comprising an organic fibrous structure (woven or non-woven) impregnated, with at least 1 wt % of a vegetable triacylglycerol, preferably a soy oil, in which at least 70%, preferably at least 75% of the fatty acids are $C_{14}$ to $C_{22}$ mono-unsaturated, and less than 16%, preferably less than 7%, more preferably less than 6% of the fatty acids are polyunsaturated.

In a fifth aspect, the invention provides a use of a vegetable oil as a heat-transfer dielectric fluid in a device to generate, store, convert and/or distribute electrical energy, wherein the vegetable oil is a triacylglycerol having at least one hydroxy fatty acid.

In a sixth aspect, the invention provides a blended high oleic oil with an improved Df value at a constant temperature comprising:
a) a first oil in the range of 1-100 vol % that is a high oleic soybean oil; and
b) a second oil in the range of 1-100 vol %; and
c) wherein the blended high oleic oil has an oleic acid content of at least 70%; and wherein the Df value, at a constant temperature, of the blended high oleic oil is improved when compared under the same conditions to an oil not comprising the high oleic soybean oil.

In a seventh aspect, the invention provides a blended high oleic oil with an improved Df value at a constant temperature comprising:
a) a first oil in the range of 1-100 vol % that is a high oleic soybean oil; and
b) a second oil in the range of 1-100 vol % that is a mono-alkyl ester of oleic acid; and
c) a third oil in the range of 1-100 vol %; and
d) wherein the blended high oleic oil has an oleic acid content of at least 70%; and wherein the Df value, at a constant temperature, of the blended high oleic oil is improved when compared under the same conditions to an oil not comprising the high oleic soybean oil and/or the purified esters of oleic acid.

BRIEF DESCRIPTION OF THE DRAWINGS AND SEQUENCE LISTING

FIG. 1 shows the dielectric loss factor (Df) vs temperature for comparative fluids C1 (FR3) and C2 (Biotemp) and a fluid for use according to the invention, E1 (one of the oils of the invention, VGO-B1), wherein the squares ■ and triangles ▲ show the loss factor for comparative fluid C1

(FR3) (measured at two different times), the crosses X show the loss factor for comparative fluid C2 (Biotemp), the diamonds ♦ show the loss factor for a soybean oil for use according to the invention E1 (VGO-B1), and the filled circles ● show the loss factor for mineral oil, which is included as a reference.

Figure 7A:
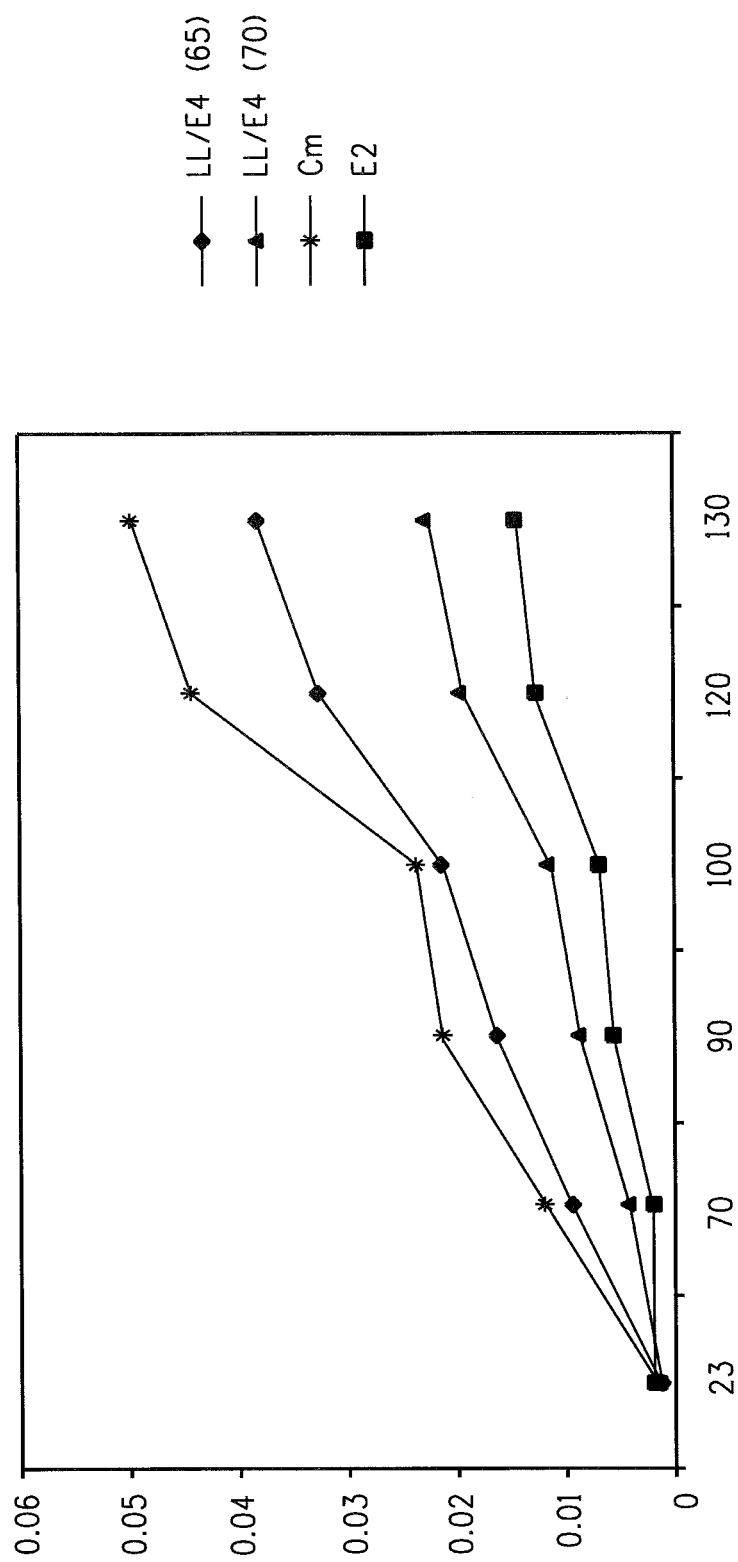

FIG. 7A shows the Df value measured vs temperature for soy oils for use according to the invention, E2, such as "HOSO"; designated by squares and high oleic soy oil having 70%, oleic acid and 16% polyunsaturates (designated by triangles), compared to soy oils having 21% oleic acid and 61% polyunsaturates ("Cm"; designated by X's), 65% oleic acid and 20% polyunsaturates (designated by diamonds).

Figure 7B:
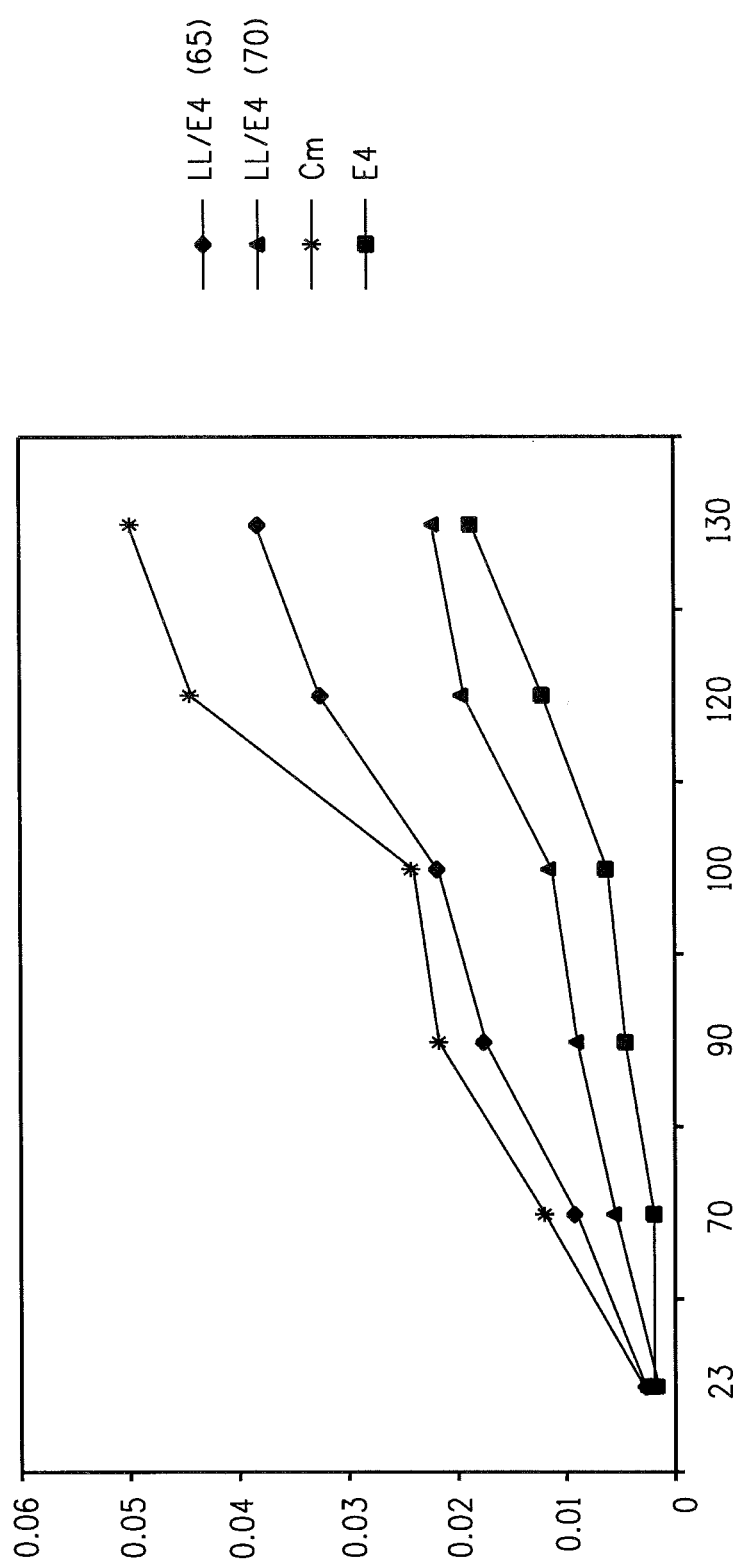

FIG. 7B shows the DF value measured vs temperature for soy oils for use according to the invention. The crosses designate the results for E4, having 74.36% oleic (74%);

The X's designate the results for the commodity soy oil (Cm) having 21% oleic acid and 61% polyunsaturates.

The triangles designate the results for a soy oil blend having 70% oleic and 16% polyunsaturates.

The diamonds designate the results for a soy oil blend having 65% oleic and 20% polyunsaturates.

Figure 8:
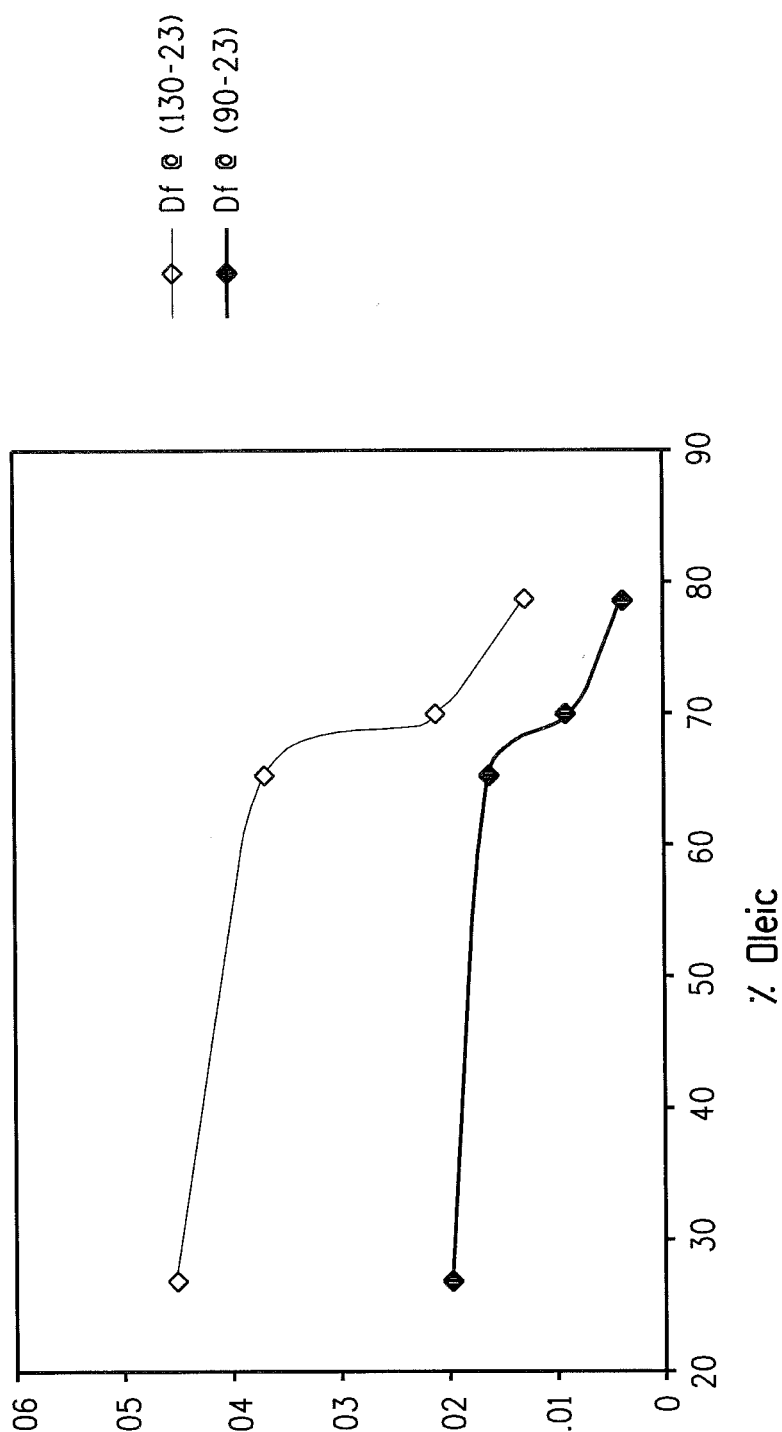

FIG. 8 shows the variation of Df vs oleic acid content for blended soy oils at two different temperatures (upper line: 130° C.; lower line: 90° C.).

Figure 9:
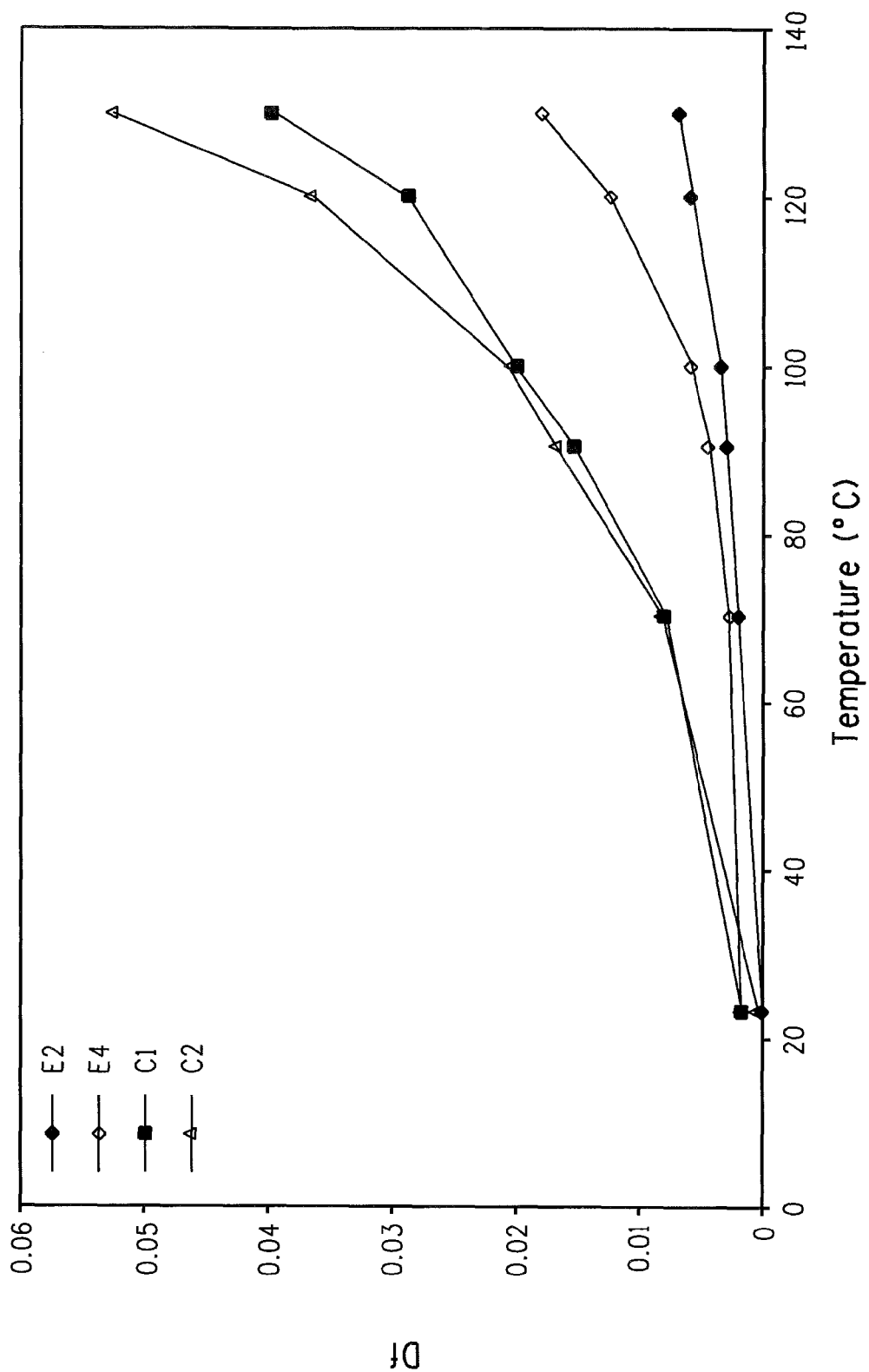

FIG. 9 shows the dielectric loss factor (Df) vs temperature for comparative fluids C1 (FR3) and C2 (Biotemp) and two oils for use according to the invention, E2 (E1, VGO-B1) and E4 (E1, VGO-B2). wherein the squares ■ show the loss factor for comparative fluid C1, the open triangles ▲ show the loss factor for comparative fluid C2, the diamonds ♦ show the loss factor for a soybean oils for use according to the invention E2 and E4.

Figure 10:
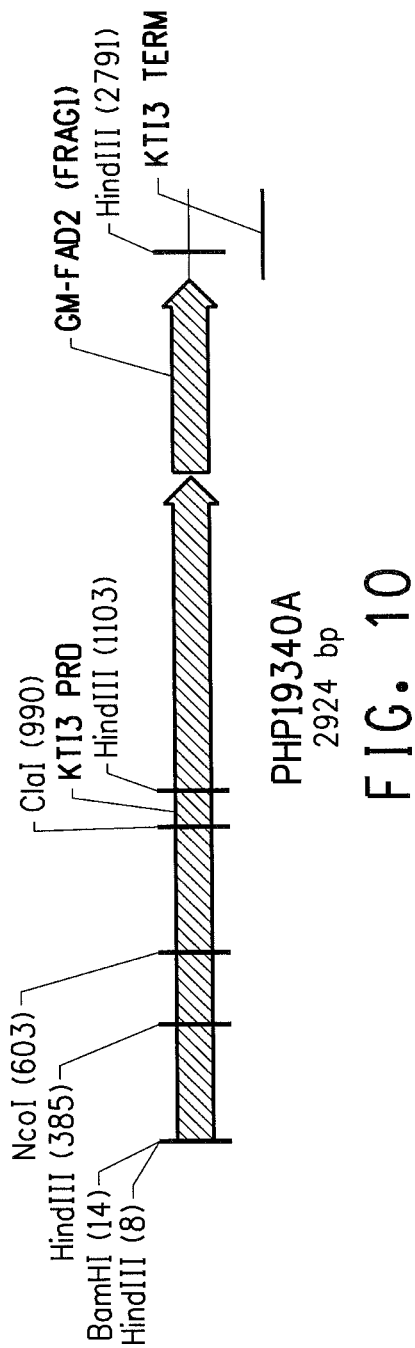
Figure 11:
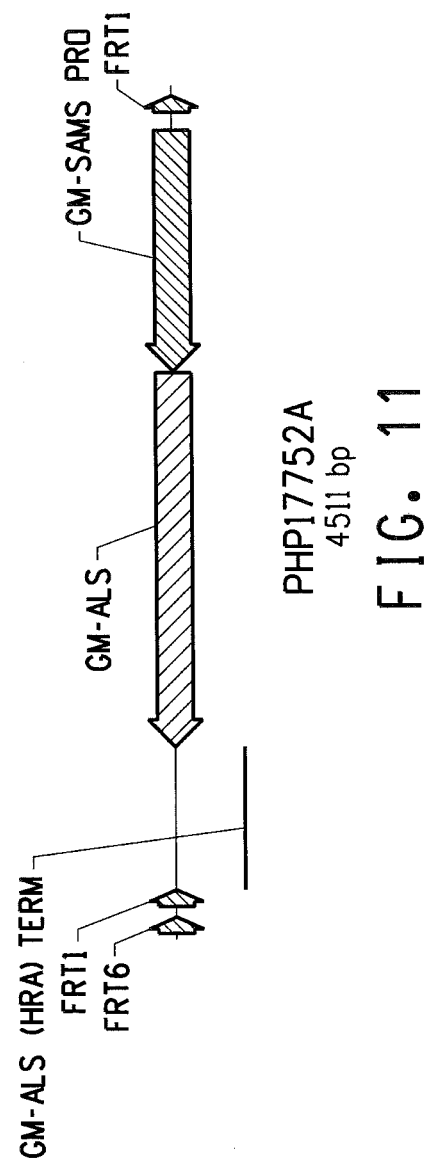
Figure 12:
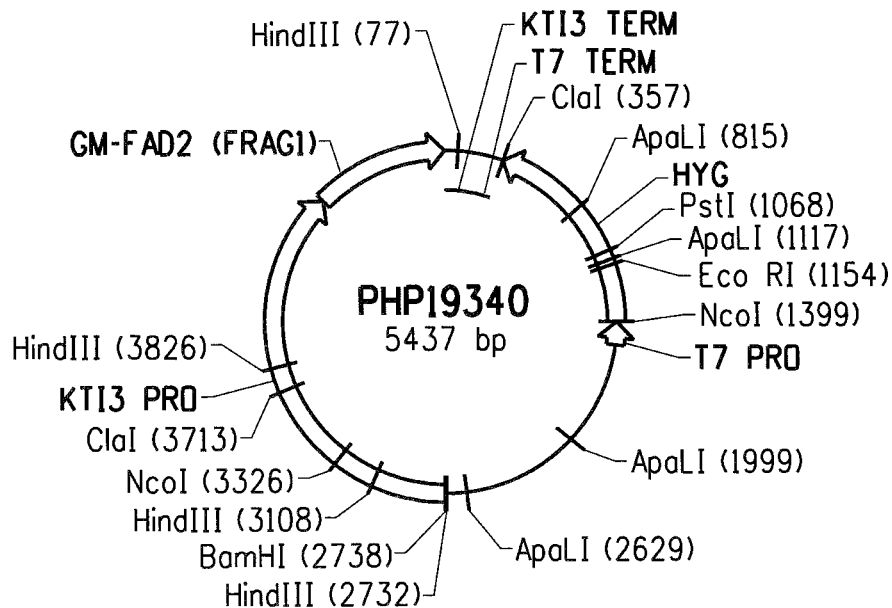
Figure 13:
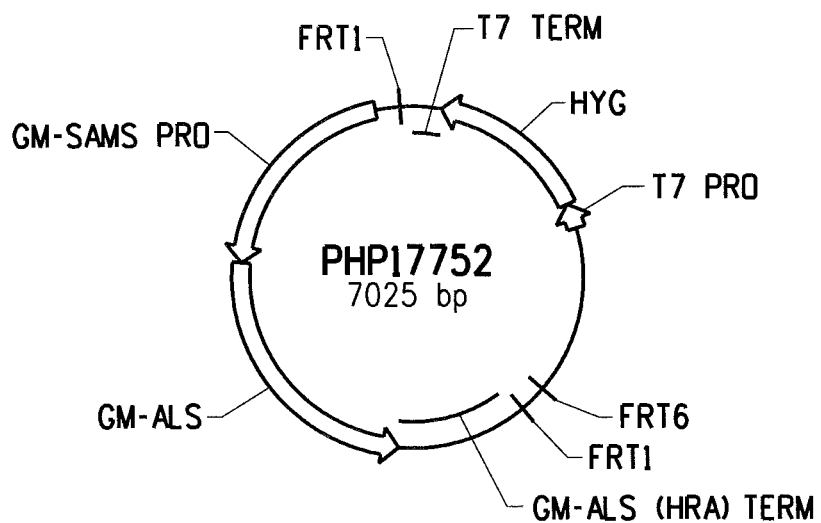
Figure 14:
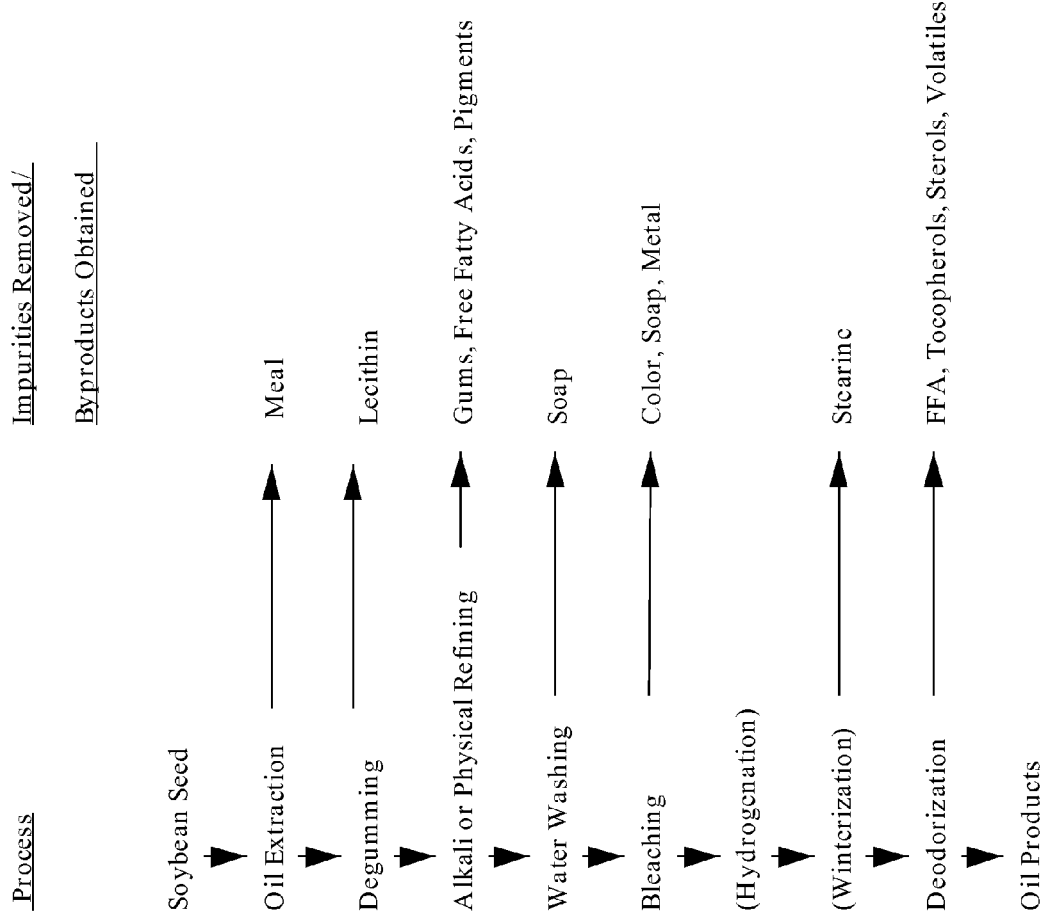

FIG. 10 depicts fragment PHP19340A.
FIG. 11 depicts fragment PHP17752A.
FIG. 12 depicts plasmid PHP19340.
FIG. 13 depicts plasmid PHP17752.
FIG. 14 depicts a diagram for the production of soybean oils and soybean by-products.

SEQ ID NO: 1 sets forth the nucleotide sequence of plasmid PHP19340A.

SEQ ID NO: 2 sets forth the nucleotide sequence of plasmid PHP17752A.

SEQ ID NO: 3 sets forth the nucleotide sequence of plasmid PHP19340.

SEQ ID NO: 4 sets forth the nucleotide sequence of plasmid PHP17752.

DETAILED DESCRIPTION OF PREFERRED EMBODIMENTS

The expressions dielectric loss factor, dielectric loss value, Df value, Df, or dielectric dissipation loss are used interchangeably herein. Df and Tan delta are frequently quoted in the literature as being equivalent.

The expression "E1" is directed to all the high oleic soy oils of the invention and includes the range of the fatty acid compositions shown in Table 1 and includes without limitation the following oils: VGO-B1, VGO-B2, HOSO, the 70% oleic soybean oil shown in Table 6, E2, and E4.

Methods

Fatty acid contents of oils may be determined using gas chromatography with flame ionization detection, or reverse-phase liquid chromatography with fluorescence detection. Percentages quoted relate to relative percent expressed as %, i.e. the area under the peak of one specific fatty acid divided by the sum of the peak areas of all fatty acid in a particular sample, unless stated otherwise.

Tocopherol content of oils is determined using an HPLC method.

The inventors found that a soy oil having a relatively high (i.e. at least 70%, preferably at least 75% of the fatty acids) content of monounsaturated $C_{14}$ to $C_{22}$ fatty acids, and less than 16%, preferably less than 7%, more preferably less than 6% of polyunsaturated fatty acids, gives particularly good performance as a heat-transfer dielectric fluid.

More preferably, the soy oil for use according to the invention has at least 80% content of monounsaturated $C_{14}$ to $C_{22}$ fatty acids, particularly preferably at least 82%, preferably at least 84% content of monounsaturated $C_{14}$ to $C_{22}$ fatty acids, or at or about 85% content of monounsaturated $C_{14}$ to $C_{22}$ fatty acids.

More preferably, the soy oil for use according to the invention has less than 4% of polyunsaturated fatty acids.

In a preferred embodiment, the soy oil for use according to the invention has at least 80% content of monounsaturated $C_{14}$ to $C_{22}$ fatty acids, and less than 4% of polyunsaturated fatty acids.

More preferably, the monounsaturated fatty acids are $C_{18}$ monounsaturated fatty acids. Most preferably, they are oleic acid.

More preferably, the polyunsaturated fatty acids are $C_{18}$ fatty acids having two or three double bonds, for example C18:2 and/or C18:3.

Preferably C18:2 is less than or equal to 5%.

More preferably, the soy oil has a C18:1 content of greater than about 75% of the fatty acid moieties, and a combined C18:2 and C18:3 content of less than 7%, more preferably less than 6% of the fatty acid.

In a preferred embodiment, the soy oil has a saturated fatty acid content of less than at or about 12%, more preferably less than at or about 10%. Higher saturated fatty acid content leads to an undesirable higher pour point, and diminished dynamic heat transfer ability.

In a particularly preferred embodiment, the soy oil has the following fatty acid content: at or about 6% C16:0, 3% C18:0, 86% C18:1, 2% C18:2 and 0-2% C18:3.

In another particularly preferred embodiment, the soy oil has the following fatty acid content: at or about 6% C16:0, 4% C18:0, 79% C18:1, 4% C18:2, 2% C18:3.

In another preferred embodiment, the soy oil has the following fatty acid content: at or about (see table below):

| Fatty acid | % |
|---|---|
| C14:0 (myristic) | 0.04 |
| C15:0 (pentadecanoic) | 0.03 |
| C16:0 (palmitic) | 6.15 |
| C16:1 n-7 (paimitoleic) | 0.10 |
| C17:0 (margaric) | 0.81 |
| C18:0 (stearic) | 3.85 |
| C18:1 n-9 (oleic) | 77.74 |
| C18:1 (octadecenoic) | 1.30 |
| C18:2 n-6 (linoleic) | 4.20 |
| C18:3 n-3 (alpha-linoleic) | 2.19 |
| C20:0 (arachidic) | 0.39 |
| C20:1 n-9 (eicosenoic) | 0.38 |
| C20:1 n-9 (eicosadienoic) | 0.40 |
| Total polyunsaturates | 6.79 |
| C22:0 (behenic) | 0.01 |
| C24:0 (lignoceric) | 0.16 |
| Others | 0.90 |

The soy oil preferably has a water content of less than at or about 300 ppm.

In a preferred embodiment, the soy oil additionally comprises tocopherol antioxidants. Preferably the tocopherols are present at a concentration of at least 85 mg/100 g of oil, more preferably at least 100 mg/100 g of oil, as measured by a known HPLC method. The tocopherol may be selected from naturally occurring tocopherols, in particular alpha-, beta- and gamma- and delta-tocopherols, and mixtures of these.

In a particularly preferred embodiment, the soy oil has a tocopherol content as measured by a known HPLC method of at or about 160 mg/100 g oil, and has the following fatty acid content: at or about 6% C16:0, 3% C18:0, 86% C18:1, 2% C18:2 and 2% C18:3.

In another particularly preferred embodiment, the soy oil has a tocopherol content as measured by a known HPLC method of at or about 160 mg/100 g oil, and has the following fatty acid content: at or about 6% C16:0, 4% C18:0, 79% C18:1, 4% C18:2, 2% C18:3.

The tocopherol is preferably tocopherol which is present in the soy oil or in any other vegetable oil as derived from the plant source or in natural plant extracts, NPE (i.e. as opposed to synthesized tocopherol that is added).

The soy oil may additionally comprise additives known in the art, which comprise generally less than 5 wt % of the dielectric heat-transfer fluid, for example: bactericides, metal chelators, corrosion inhibitors, antioxidants, heat-stabiliser, viscosity adjusters, pour point depressants, including natural plant extract promoting those functionalities etc.

The soy oil for use according to the invention can be blended with other fluids used for dielectric heat-transfer fluids, such as other vegetable oils, mineral oil, etc.

In a particularly preferred embodiment, the oil is derived from soybeans prepared by recombinant manipulation to give increased expression of the activity of the gene encoding oleoyl 12-desaturase.

An exemplary description of a suitable genetic manipulation in soybeans is described in U.S. Pat. No. 5,981,781 (E.I. du Pont de Nemours and Company), and is detailed below:

In soy (*Glycine max*) there are two genes encoding oleoyl 12-desaturase activity, one of which (GmFad 2-1) is expressed only in the developing seed (Heppard et al. (1996) Plant Physiol. 110:311-319). The expression of this gene increases during the period of oil deposition, starting around 19 days after flowering, and its gene product is responsible for the synthesis of the polyunsaturated fatty acids found in soybean oil. GmFad 2-1 is described in detail by Okuley, J. et al. (1994) Plant Cell 6:147-158 and in WO94/11516. It is available from the ATCC in the form of plasmid pSF2-169K (ATCC accession number 69092). The other gene (GmFad 2-2) is expressed in the seed, leaf, root and stem of the soy plant at a constant level and is the "housekeeping" 12-desaturase gene. The Fad 2-2 gene product is responsible for the synthesis of polyunsaturated fatty acids for cell membranes.

GmFad 2-1 was placed under the control of a strong, seed-specific promoter derived from the α'-subunit of the soybean (*Glycine max*) beta-conglycinin gene. This promoter allows high level, seed specific expression of the trait gene. It spans the 606 bp upstream of the start codon of the α' subunit of the *Glycine max* β-congylcinin storage protein. The β-conglycinin promoter sequence represents an allele of the published β-conglycinin gene (Doyle et al., (1986) J. Biol. Chem. 261:9228-9238) having differences at 27 nucleotide positions. It has been shown to maintain seed specific expression patterns in transgenic plants (Barker et al., (1988) Proc. Natl. Acad. Sci. 85:458-462 and Beachy et al., (1985) EMBO J. 4:3047-3053). The reading frame was terminated with a 3' fragment from the phaseolin gene of green bean (*Phaseolus vulgaris*). This is a 1174 bp stretch of sequences 3' of the *Phaseolus vulgaris* phaseolin gene stop codon (originated from clone described in Doyle et al., 1986).

The GmFad 2-1 open reading frame (ORF) was in a sense orientation with respect to the promoter so as to produce a gene silencing of the sense GmFad 2-1 cDNA and the endogenous GmFad 2-1 gene. This phenomenon, known as "sense suppression" is an effective method for deliberately turning off genes in plants and is described in U.S. Pat. No. 5,034,323.

For maintenance and replication of the plasmid in *E. coli* the GmFad 2-1 transcriptional unit described above was cloned into plasmid pGEM-9z (−) (Promega Biotech, Madison Wis., USA).

For identification of transformed soybean plants the β-glucuronidase gene (GUS) from *E. coli* was used. The cassette used consisted of the three modules; the Cauliflower Mosaic Virus 35S promoter, the β-glucuronidase gene (GUS) from *E. coli* and a 0.77 kb DNA fragment containing the gene terminator from the nopaline synthase (NOS) gene of the Ti-plasmid of *Agrobacterium tumefaciens*. The 35S promoter is a 1.4 kb promoter region from CaMV for constitutive gene expression in most plant tissues (Odell et al. (1985) Nature 303:810-812), the GUS gene a 1.85 kb fragment encoding the enzyme β-glucuronidase (Jefferson et al. (1986) PNAS USA 83:8447-8451) and the NOS terminator a portion of the 3' end of the nopaline synthase coding region (Fraley et al., (1983) PNAS US 80:48034807). The GUS cassette was cloned into the GmFad 2-1/pGEM-9z (−) construct and was designated pBS43.

Plasmid pBS43 was transformed into meristems of the elite soybean line A2396, by the method of particle bombardment (Christou et al., (1990) Trends Biotechnol. 8:145-151). Fertile plants were regenerated using methods well known in the art.

From the initial population of transformed plants, a plant was selected which was expressing GUS activity and which was also positive for the GmFad 2-1 gene (Event 260-05)

when evaluated by PCR. Small chips were taken from a number of R1 seeds of plant 260-05 and screened for fatty acid composition. The chipped seed was then planted and germinated. Genomic DNA was extracted from the leaves of the resulting plants and cut with the restriction enzyme Bam HI. The blots were probed with a phaseolin probe.

From the DNA hybridization pattern it was clear that in the original transformation event the GmFad 2-1 construct had become integrated at two different loci in the soybean genome. At one locus (Locus A) the GmFad 2-1 construct was causing a silencing of the endogenous GmFad 2-1 gene, resulting in a relative oleic acid content of about 85% (compared with about 20% in elite soybean varieties). At locus A there were two copies of pBS43. On the DNA hybridization blot this was seen as two cosegregating bands. At the other integration locus (Locus B) the GmFad 2-1 was over-expressing.

Fourth generation segregant lines (R4 plants), generated from the original transformant, were allowed to grow to maturity. R4 seeds, which contained only the silencing Locus A (e.g., G94-1) did not contain any detectable GmFad 2-1 mRNA (when measured by Northern blotting) in samples recovered 20 days after flowering. GmFad 2-2 mRNA, although reduced somewhat compared with controls, was not suppressed. Thus the GmFad 2-1 sense construct had the desired effect of preventing the expression of the GmFad 2-1 gene and thus increasing the oleic acid content of the seed. All plants homozygous for the GmFad 2-1 silencing locus had an identical Southern blot profile over a number of generations. This indicates that the insert was stable and at the same position in the genome over at least four generations.

The soy oil is extracted from the plant source using known methods of extraction. Preferred methods of extractions are those that avoid steps that result in destruction of the natural tocopherol content. For example, it is preferred to avoid heating the oil to above 200° C. for prolonged periods, for example during deodorization steps which can be reduced or eliminated. In some instances it might be preferred to avoid hydrogenation.

It is also preferred to take fractions of the oil, which are "first" extracted meaning prior to a more exhaustive extraction of the oil out of the seed. Physical extraction is preferred over solvent extraction or any combined extraction process, which privileges the physical extraction step.

Methods for the extraction and processing of soybean seeds to produce soybean oil and meal are well known throughout the soybean processing industry. In general, soybean oil is produced using a series of steps which accomplish the extraction and purification of an edible oil product from the oil bearing seed. The oils of the invention are not limited to food-grade oils.

Soybean seeds are cleaned, tempered, dehulled, and flaked which increases the efficiency of oil extraction. Oil extraction is usually accomplished by solvent (hexane) extraction but can also be achieved by a combination of physical pressure and/or solvent extraction. The resulting oil is called crude oil. The crude oil may be degummed by hydrating phospholipids and other polar and neutral lipid complexes which facilitate their separation from the nonhydrating, triglyceride fraction (soybean oil). The resulting lecithin gums may be further processed to make commercially important lecithin products used in a variety of food and industrial products as emulsification and release (antisticking) agents. Degummed oil may be further refined for the removal of impurities; primarily free fatty acids, pigments, and residual gums. Refining is accomplished by the addition of caustic which reacts with free fatty acid to form soap and hydrates phosphatides and proteins in the crude oil. Water is used to wash out traces of soap formed during refining. The soapstock by-product may be used directly in animal feeds or acidulated to recover the free fatty acids. Color is removed through adsorption with a bleaching earth, powdered activated carbon and/or synthetic neutral resin. Which removes most of the chlorophyll and carotenoid compounds. Deodorization which is principally steam distillation under vacuum, is the last step and is designed to remove compounds which impart odor or flavor to the oil. A more detailed reference to soybean seed processing, soybean oil production and by-product utilization can be found in Erickson, 1995, Practical Handbook of Soybean Processing and Utilization, The American Oil Chemists' Society and United Soybean Board.

A second aspect of the invention provides a device to generate, store, convert and/or distribute electrical energy with or without optical signals therewith, comprising:
(a) a conducting material;
(b) a dielectric material; and
(c) a heat-transfer dielectric fluid, which is a soy oil in which at least 70%, preferably at least 75% of the fatty acids are $C_{14}$ to $C_{22}$ mono-unsaturated, and less than 16%, preferably less than 7%, more preferably less than 6% of the fatty acids are polyunsaturated.

The heat-transfer dielectric fluid used in the device of the invention may be any of the preferred oils for use in the invention described herein and any mixtures thereof.

In a preferred embodiment, the device is a transformer. Typically, the transformer will have conducting material in the form of coils or windings of conducting wire and connections (e.g. copper, aluminium, iron, steel, silver, etc.). The conducting material is wound around and covered in the dielectric material, which is typically chosen from woven or non-woven fibrous material, films and laminates, such as paper, board and/or multidimensional structures. The paper or board may be cellulosic or it may be, for example, composed of aramid fibres, preferably m-aramid fibres, polyimides, polyphenylsulfones, polyamides, polyesters (e.g. PET) and polyethylene, and combination therewith in various forms composites, laminates and tailored morphologically tailored surfaces and/or multidimensional structures and hybrids/mixtures thereof. The conducting material and the dielectric material are placed in a receptacle and the dielectric heat-transfer fluid is added to submerse or partially submerse the components. Alternatively, the dielectric material (e.g. paper or board) is impregnated with the dielectric heat-transfer fluid by absorption ("imbibing") at various stages of its processing.

In another preferred embodiment, the dielectric heat-transfer fluid may be used for example in a generator, a capacitor, an inverter or electric motor, a switch and cables.

A third aspect of the invention is a method for preconditioning a heat-transfer dielectric fluid which is a vegetable triacylglycerol, comprising the step:
(a) exposing said fluid to a constant and uniformly distributed electromagnetic field. The electromagnetic field may be applied continuously or in series of constant and/or variable pulse and relaxation sequences; repeating the exposure as often as needed.

The beneficial effect of the pre-treatment extends to all triacylglycerol dielectric heat-transfer fluids and mixtures thereof, and is not limited to the fluid used in the use according to the invention.

In a preferred embodiment, the electromagnetic field is applied in the form of microwaves.

Preferably the electromagnetic field is applied at sufficient power and for a sufficient period of time to treat the vegetable triacylglycerol to at least at or about 100° C., preferably at least at or about 120° C., but not higher than at or about 170° C., more preferably not higher than at or about 160° C. It is particularly preferred to heat the vegetable triacylglycerol to at or about 140° C.

After exposing the fluid to the electromagnetic filed, it is allowed to cool.

In one embodiment, the vegetable triacylglycerol is exposed to the electromagnetic field as a neat fluid (i.e. in a suitable receptacle), and then used as desired. In another embodiment, the vegetable triacylglycerol is first applied to an absorbent dielectric material, such as paper (e.g. cellulosic or aramid), and then the imbibed paper is subjected to the electromagnetic field including in-line processing treatment. Such in-line or off-line processing treatments will be preferably performed in a way that maximize the exposure of the oil to the electromagnetic field such as reducing gradients, mainly temperature and/or electromagnetic radiation flux, within the bulk of the material treated. Falling film transfer equipment and/or droplet chambers are suitable.

A fourth aspect of the invention is a dielectric material comprising an organic fibrous structure (e.g. woven tissues or textiles or non-woven) impregnated with at least 1 wt % of a vegetable triacylglycerol, preferably a soy oil, in which at least 70%, preferably at least 75% of the fatty acids are $C_{14}$ to $C_{22}$ mono-unsaturated, and less than 16%, preferably less than 7%, more preferably less than 6% of the fatty acids are polyunsaturated.

The vegetable triacylglycerol used for impregnation may be any of the fluids for use according to the invention described herein.

In a preferred embodiment, the organic fibrous structure is a non-woven made of cellulosic or aramid fibres, polyimides, polyphenylsulfones, polyamides, polyesters (e.g. PET) and polyethylene and combination therewith in various forms composites, laminates and tailored morphologically tailored surfaces and/or multidimensional structures and hybrids/mixtures thereof.

The vegetable triacylglycerol is preferably present at about 1 wt %-10 wt %, more preferably 10 wt % to about 50 wt %, even more preferably at or about 20 wt % to 40 wt %.

In a fifth aspect, the invention provides a use of a vegetable oil as a heat-transfer dielectric fluid in a device to generate, store, convert and/or distribute electrical energy, wherein the vegetable oil is a triacylglycerol having at least one hydroxy fatty acid. Preferably the hydroxyl fatty acid is cis-12-hydroxyoctadec-9-enoic acid, preferably having the D configuration at the chiral carbon. In a particularly preferred embodiment all of the fatty acids in the triacylglycerol are D-cis-12-hydroxyoctadec-9-enoic acid (Castor oil or ricinoleic acid) and this triacylglycerol is mixed in varying proportions with a triacylglycerol in which at least 70%, preferably at least 75% of the fatty acids are $C_{14}$ to $C_{22}$ mono-unsaturated, and less than 16%, preferably less than 7%, more preferably less than 6% of the fatty acids are polyunsaturated. Preferably, in a blend, the castor oil represents from 5 to 15% of the triacylglycerol.

The term "high oleic soybean" refers to soybean seeds that have an oleic acid content of at least 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, and 95%. Preferred high oleic soybean oil starting materials are disclosed in World Patent Publication WO94/11516, the disclosure of which is hereby incorporated by reference.

The term "high oleic oil" refers to an oil having an oleic acid content of at least 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, and 95%.

Useful examples of contents of polyunsaturated of the oil for the use of the present invention are less than 16%, 15%, 14%, 13%, 12%, 11%, 10%, 9%, 8%, 7%, 6%, 5%, 4%, 3%, 2%, 1%.

In a sixth aspect, the invention provides a blended high oleic oil with an improved Df value at a constant temperature comprising:
a) a first oil in the range of 1-100 vol % that is a high oleic soybean oil; and
b) a second oil in the range of 1-100 vol %; and
c) wherein the blended high oleic oil has an oleic acid content of at least 70%; and wherein the Df value, at a constant temperature, of the blended high oleic oil is improved when compared under the same conditions to an oil not comprising the high oleic soybean oil.

Useful examples of percent volume for the oils a) and b) of the blended oil of the invention are 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, 99%, and 100%. The amount of oil which can be used will depend upon the desired properties sought to be achieved in the resulting final blended oil product.

In a seventh aspect, the invention provides a blended high oleic oil with an improved Df value at a constant temperature comprising:
a) a first oil in the range of 1-100 vol % that is a high oleic soybean oil; and
b) a second oil in the range of 1-100 vol % that is a mono-alkyl ester of oleic acid; and
c) a third oil in the range of 1-100 vol %; and
d) wherein the blended high oleic oil has an oleic acid content of at least 70%; and wherein the Df value, at a constant temperature, of the blended high oleic oil is improved when compared under the same conditions to an oil not comprising the high oleic soybean oil and/or the purified esters of oleic acid.

Useful examples of percent volume for the oils a), b) and c) of the blended oil of the invention are 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, 99%, and 100%. The amount of oil which can be used will depend upon the desired properties sought to be achieved in the resulting final blended oil product.

The oil b) that is a mono-alkyl ester of oleic acid can be any $C_1$-$C_{12}$ alkyl ester of oleic acid. Particularly preferred are $C_1$-$C_8$ alkyl esters, more preferably $C_1$-$C_6$ alkyl esters, such as methyl, ethyl, propyl, butyl, pentyl and hexyl esters, both straight and branched.

The oil described herein was tested for its suitability as a heat-transfer dielectric fluid by measuring the dielectric dissipation loss, Df. Df is an important parameter to compare fluids used for dielectric insulation and/or heat transfer in the presence of electrical and/or magnetic fields.

The dielectric dissipation loss, Df, in part, represents the tendency of the fluid in an alternating electromagnetic field to depart from the ideal of a pure dielectric medium in which no energy dissipation losses would occur. The dielectric loss typically increases with the presence of impurities in the fluid, especially charged impurities, with increase in water content, with free acids and with molecular breakdown of the fluid into smaller species. Furthermore, the stability of the dielectric loss versus temperature within a representative temperature range is an insurance of a durable fluid composition exhibiting good performance over prolonged period of time (i.e. good aging behaviour).

The measurement of Df is made using ASTM D924, and is based on the superheterodyne principle.

In one aspect the soy oil or blended oil for use according to the invention preferably shows a Df of less than at or about $1.2 \times 10^{-3}$ when measured at 23° C., preferably less than at or about $5.4 \times 10^{-3}$ when measured at 70° C., preferably less than $9.1 \times 10^{-3}$ when measured at 90° C., preferably less than at or about $1.21 \times 10^{-2}$ when measured at 100° C., preferably less than at or about $1.95 \times 10^{-2}$ when measured at 120° C., preferably less than at or about $2.32 \times 10^{-2}$ when measured at 130° C., and preferably, it shows a Df of less than at or about $2.32 \times 10^{-2}$ over a temperature range of at or about 23-130° C.

In another aspect the soy oil or blended oil for use according to the invention preferably shows a Df of less than at or about $2.5 \times 10^{-4}$ when measured at 23° C., preferably less than at or about $2.5 \times 10^{-3}$, more preferably less than at or about $1.5 \times 10^{-3}$ when measured at 70° C., preferably less than at or about $5 \times 10^{-2}$, more preferably less than at or about $3 \times 10^{-3}$ when measured at 90° C., preferably less than at or about $7 \times 10^{-3}$, more preferably less than at or about $4 \times 10^{-3}$ when measured at 100° C., preferably less than at or about $2 \times 10^{-2}$, more preferably less than at or about $7 \times 10^{-3}$ when measured at 120° C., and preferably less than at or about $2 \times 10^{-2}$, more preferably less than at or about $1 \times 10^{-2}$ when measured at 130° C. Preferably, it shows a Df of less than at or about $2 \times 10^{-2}$, more preferably less than at or about $1 \times 10^{-2}$ over a temperature range of at or about 23-130° C.

In one aspect for the use according to the invention, a blended oil may be used. Such blends are made by blending a high oleic soy oil having an oleic acid content of at least 70%, preferably at least 75% with another oil, preferably a vegetable oil. The quantity of high oleic soy oil to be added to another oil may be determined by titration: the high oleic soy oil may be added until the blended oil has a Df of less than at or about $1.2 \times 10^{-3}$ when measured at 23° C., preferably less than at or about $5.4 \times 10^{-3}$ when measured at 70° C., preferably less than $9.1 \times 10^{-3}$ when measured at 90° C., preferably less than at or about $1.21 \times 10^{-2}$ when measured at 100° C., preferably less than at or about $1.95 \times 10^{-2}$ when measured at 120° C., preferably less than at or about $2.32 \times 10^{-2}$ when measured at 130° C., and preferably, it shows a Df of less than at or about $2.32 \times 10^{-2}$ over a temperature range of at or about 23-130° C.

The high oleic soy oil that is used for blending preferably has a polyunsaturated content of less than at or about 16%, more preferably less than at or about 7%.

In another aspect for the use according to the invention, a blended oil may be used. Such blends are made by blending a high oleic soy oil having an oleic acid content of at least 70%, preferably at least 75% with another oil, preferably a vegetable oil. The quantity of high oleic soy oil to be added to another oil may be determined by titration: the high oleic soy oil may be added until the blended oil has a Df of less than at or about $2.5 \times 10^{-4}$ when measured at 23° C., preferably less than at or about $2.5 \times 10^{-3}$, more preferably less than at or about $1.5 \times 10^{-3}$ when measured at 70° C. preferably less than at or about $5 \times 10^{-3}$, more preferably less than at or about $3 \times 10^{-3}$ when measured at 90° C., preferably less than at or about $7 \times 10^{-3}$, more preferably less than at or about $4 \times 10^{-3}$ when measured at 100° C. preferably less than at or about $2 \times 10^{-2}$, more preferably less than at or about $7 \times 10^{-3}$ when measured at 120° C., and preferably less than at or about $2 \times 10^{-2}$, more preferably less than at or about $1 \times 10^{-2}$ when measured at 130° C. Preferably, the blended oil shows a Df of less than at or about 0.02, more preferably less than at or about $1 \times 10^{-2}$ over a temperature range of at or about 23-130° C. The high oleic soy oil that is used for blending preferably has a polyunsaturated content of less than at or about 16%, more preferably less than at or about 7%.

A dynamic (natural or forced) heat transfer takes place in most electrical equipment cooled and electrically insulated with oils. The heating of a liquid filled transformer must be controlled, in large proportion by the coolant and dielectric fluid, taking into account fairly large temperature variations, between the internal hotspots and the external temperature extremes, in winter and in summer. Under good controlled conditions the transformer can be in operation for more than 30 years; but can also be quickly damaged with relatively small deviations, sometime less than 10° C., from the ideal operating temperature defined for each category of transformers and the energy transformation load for which they have been designed.

At least four important properties of the oil vary with temperature, each of them at various degrees leading to reversible or irreversible property changes in the dielectric heat-transfer fluid (oil). These properties are the density, the thermal conductivity, the dynamic viscosity (all three of which decrease with increasing temperature) and the specific heat (which increases with increasing temperature).

For an oil temperature variation from 25° C. to 85° C., it is preferred that the density change be less than at or about 5%, the conductivity change be less than at or about 3%, the heat capacity change be less than at or about 10%. The viscosity change is by far the most substantial, since it can reach 50% for the same range of temperature.

Therefore the viscosity, which contributes to the fluid mechanics via the Re number (Reynold Re= (velocity·diameter·density)/viscosity), directly impacts the fluid's heat-transfer capability, yielding a poorer heat transfer when the viscosity increases and a better one if the viscosity decreases.

EXAMPLES

Example 1

Transformation of Soybean (*Glycine max*)

Embryo Cultures and Regeneration of Soybean Plants.

Soybean embryogenic suspension cultures are transformed by the method of particle gun bombardment using procedures known in the art (Klein et al. (1987) Nature (London) 327:70 73; U.S. Pat. No. 4,945,050; Hazel et al. (1998) Plant Cell. Rep. 17:765 772; Samoylov et al. (1998) In Vitro Cell Dev. Biol. Plant 34:8 13). In particle gun bombardment procedures it is possible to use purified 1) entire plasmid DNA or, 2) DNA fragments containing only the recombinant DNA expression cassette(s) of interest. Stock tissue for transformation experiments are obtained by initiation from soybean immature seeds. Secondary embryos are excised from explants after 6 to 8 weeks on culture initiation medium. The initiation medium is an agar solidified modified MS (Murashige and Skoog (1962) Physiol. Plant. 15:473 497) medium supplemented with vitamins, 2, 4-D and glucose. Secondary embryos are placed in flasks in liquid culture maintenance medium and maintained for 7-9 days on a gyratory shaker at 26+/−2° C. under ~80 μEm-2s-1 light intensity. The culture maintenance medium is a modified MS medium supplemented with vitamins, 2, 4-D, sucrose and asparagine. Prior to bombardment, clumps of tissue are removed from the flasks and moved to an empty 60×15 mm petri dish for bombardment. Tissue is dried by blotting on Whatman #2 filter paper. Approximately 100-200 mg of tissue corresponding to 10-20 clumps (1-5 mm in size each) are used per plate of bombarded tissue.

After bombardment, tissue from each bombarded plate is divided and placed into two flasks of liquid culture maintenance medium per plate of bombarded tissue. Seven days post bombardment, the liquid medium in each flask is replaced with fresh culture maintenance medium supplemented with 100 ng/ml selective agent (selection medium). For selection of transformed soybean cells the selective agent used can be a sulfonylurea (SU) compound with the chemical name, 2 chloro N ((4 methoxy 6 methyl 1,3,5 triazine 2 yl)aminocarbonyl) benzenesulfonamide (common names: DPX-W4189 and chlorsulfuron). Chlorsulfuron is the active ingredient in the DuPont sulfonylurea herbicide, GLEAN®. The selection medium containing SU is replaced every week for 6-8 weeks. After the 6-8 week selection period, islands of green, transformed tissue are observed growing from untransformed, necrotic embryogenic clusters. These putative transgenic events are isolated and kept in media with SU at 100 ng/ml for another 2-6 weeks with media changes every 1-2 weeks to generate new, clonally propagated, transformed embryogenic suspension cultures. Embryos spend a total of around 8-12 weeks in contact with SU. Suspension cultures are subcultured and maintained as clusters of immature embryos and also regenerated into whole plants by maturation and germination of individual somatic embryos.

Example 2

Genetic Material Used to Produce the High Oleic Trait

A Soybean (*Glycine max*) event was produced by particle co-bombardment as described in Example 1 with fragments PHP19340A (FIG. 10; SEQ ID NO: 1) and PHP17752A (FIG. 11; SEQ ID NO: 2). These fragments were obtained by Asc I digestion from a source plasmid. Fragment PHP19340A was obtained from plasmid PHP19340 (FIG. 12; SEQ ID NO: 3) and fragment PHP17752A was obtained from plasmid PHP17752 (FIG. 13; SEQ ID NO: 4). The PHP19340A fragment contains a cassette with a 597 bp fragment of the soybean microsomal omega-6 desaturase gene 1 (gm-fad2-1) (Heppard et al., 1996, Plant Physiol. 110: 311-319).

The presence of the gm-fad2-1 fragment in the expression cassette acts to suppress expression of the endogenous omega-6 desaturases, resulting in an increased level of oleic acid and decreased levels of palmitic, linoleic, and linolenic acid levels. Upstream of the gm-fad2-1 fragment is the promoter region from the Kunitz trypsin inhibitor gene 3 (KTi3) (Jofuku and Goldberg, 1989, Plant Cell 1: 1079-1093; Jofuku et al., 1989, Plant Cell 1: 427-435) regulating expression of the transcript. The KTi3 promoter is highly active in soy embryos and 1000-fold less active in leaf tissue (Jofuku and Goldberg, 1989, Plant Cell 1: 1079-1093). The 3' untranslated region of the KTi3 gene (KTi3 terminator) (Jofuku and Goldberg, 1989, Plant Cell 1: 1079-1093) terminates expression from this cassette.

The PHP17752A fragment contains a cassette with a modified version of the soybean acetolactate synthase gene (gm-hra) encoding the GM-HRA protein with two amino acid residues modified from the endogenous enzyme and five additional amino acids at the N-terminal region of the protein derived from the translation of the soybean acetolactate synthase gene 5' untranslated region (Falco and Li, 2003, US Patent Application: 2003/0226166). The gm-hra gene encodes a form of acetolactate synthase, which is tolerant to the sulfonylurea class of herbicides. The GM-HRA protein is comprised of 656 amino acids and has a molecular weight of approximately 71 kDa.

The expression of the gm-hra gene is controlled by the 5' promoter region of the S-adenosyl-L-methionine synthetase (SAMS) gene from soybean (Falco and Li, 2003, US Patent Application: 2003/0226166). This 5' region consists of a constitutive promoter and an intron that interrupts the SAMS 5' untranslated region (Falco and Li, 2003). The terminator for the gm-hra gene is the endogenous soybean acetolactate synthase terminator (als terminator) (Falco and Li, 2003, US Patent Application: 2003/0226166).

Example 3

Transformation and Selection for the Soybean High Oleic Event

For transformation of soybean tissue, a linear portion of DNA, containing the gm-fad2-1 gene sequence and the regulatory components necessary for expression, was excised from the plasmid PHP19340 through the use of the restriction enzyme Asc I and purified using agarose gel electrophoresis. A linear portion of DNA, containing the gm-hra gene sequences and the regulatory components necessary for expression, was excised from the plasmid PHP17752 through the use of the restriction enzyme Asc I and purified using agarose gel electrophoresis. The linear portion of DNA containing the gm-fad2-1 gene is designated insert PHP19340A and is 2924 bp in size. The linear portion of DNA containing the gm-hra gene is designated insert PHP17752A and is 4511 bp in size. The only DNA introduced into transformation event DP-305423-1 was the DNA of the inserts described above.

The transgenic plants from event DP-305423-1 were obtained by microprojectile bombardment as described in Example 1. Embryogenic tissue samples were taken for molecular analysis to confirm the presence of the gm-fad2-1 and gm-hra transgenes by Southern analysis. Plants were regenerated from tissue derived from each unique event and transferred to the greenhouse for seed production.

Example 4

Southern Analysis of Plants Containing the High Oleic Event

Materials and Methods: Genomic DNA was extracted from frozen soybean leaf tissue of individual plants of the T4 and T5 generations of DP 305423 1 and of control (variety: Jack) using a standard Urea Extraction Buffer method. Genomic DNA was quantified on a spectrofluorometer using Pico Green® reagent (Molecular Probes, Invitrogen). Approximately 4 µg of DNA per sample was digested with Hind III or Nco I. For positive control samples, approximately 3 pg (2 genome copy equivalents) of plasmid PHP19340 or PHP17752 was added to control soybean genomic DNA prior to digestion. Negative control samples consisted of unmodified soybean genomic DNA (variety: Jack). DNA fragments were separated by size using agarose gel electrophoresis.

Following agarose gel electrophoresis, the separated DNA fragments were depurinated, denatured, neutralized in situ, and transferred to a nylon membrane in 20×SSC buffer using the method as described for TURBOBLOTTER™ Rapid Downward Transfer System (Schleicher & Schuell). Following transfer to the membrane, the DNA was bound to the membrane by UV crosslinking.

DNA probes for gm-fad2-1 and gm-hra were labelled with digoxigenin (DIG) by PCR using the PCR DIG Probe Synthesis Kit (Roche).

Labelled probes were hybridized to the target DNA on the nylon membranes for detection of the specific fragments using DIG Easy Hyb solution (Roche) essentially as described by manufacturer. Post-hybridization washes were carried out at high stringency. DIG labelled probes hybridized to the bound fragments were detected using the CDP-Star Chemiluminescent Nucleic Acid Detection System (Roche). Blots were exposed to X ray film at room temperature for one or more time points to detect hybridizing fragments. The fatty Acid composition of the event was determined as described in Example 2. Oleic acid levels determined in 29 different events (T1 generation) ranged from 61.5-84.6%. Oleic acid level from one event (T4-T5 generation) ranged from 72-82%.

Example 5

Fatty Acid Contents and Compositions

Qualitative and quantitative fatty acid compositions of oils were determined using modifications of AOCS Ce 2-66 (Preparations of methyl esters of fatty acids) and AOCS Ce 1e-91 (Determination of fatty acids in edible oils and fats by capillary GLC) official methodologies as follows. Oil stocks were prepared by adding 0.5000 gm (weighed and recorded to an precision of 0.0001 g) of oil and 0.0130 g to 0.0260 g (weighed and recorded to an precision of 0.0001 g) of internal standard (tri-pentadecanoin; NuChek Prep; Elysian Minn. USA) to a 10 ml volumetric flask; the internal standard was omitted where the analysis was limited to qualitative (area %) data. Seven ml heptane was added and the stock was sonicated for 2 min to ensure full dissolution of the Internal Standard Powder (IST) powder. After cooling to room temperature the stock was brought to volume with heptane. Stocks were prepared immediately prior to analysis. Dilution series of the oils stocks were then prepared by adding 0, 50, 100, (4×150), 200, 250, and 300 ul (~0-0.0150 g oil per tube) of the oil stock to pre-labelled tubes (glass 13×100 mm with Teflon lid inserts; VWR 53283 800 tubes, 60826-304 caps; VWR Bridgeport N.J., USA) and bringing each sample to a final volume of 300 ul with heptane. The tubes were prepared for derivatization by wrapping the threaded portions with PTFE sealant tape. Derivatization was performed as follows: The tubes were vortex mixed and 1 mL of derivatization acid stock (prepared by adding 5 mL acetyl chloride (Fluka 00990; Sigma Aldrich St Louis Mo., USA) to 50 ml ice-cold anhydrous methanol) was added. The tubes were capped tightly, re-vortex and incubated at 80° C. in a heat block for 1 hr. The tubes were cooled to room temp and 1 mL of aqueous 1 M NaCl was added followed 0.5 mL heptane. The samples were vigorously vortex mixed and the phases were allowed to separate prior to transferring ~200 uL of the upper (heptane) phase to a GC sample vial fitted with a liner (Part #225350-631SP; Wheaton, Millville N.J., USA). Samples were analyzed by GC as follows. An Agilent 6890 fitted with an Omegawax 320 (Supelco, Bellefonte Pa., USA) capillary column (30 m×0.32 mm ID; 0.25 um film thickness). One ul samples were injected at a 10:1 split ratio into the GC inlet which was heated to 250° C. Hydrogen was used as the carrier gas at a linear velocity of 39 cm/sec (constant flow mode). The initial oven temperature was 160° C. for 4 min and the oven temperature was then ramped to 220° C. at 2 C/min and was then held at the final temperature for 10 min (total run time 44 min). Detection was by flame ionization and a NuChek Prep 461 Standard (1:100 dilution in heptane; NuChek Prep; Elysian Minn., USA) was used to identify peaks, by co-chromatography. All peaks with an area>0.01% were included in the analysis.

Tocopherol Analysis

Tocopherol contents were measured according to AOCS Official Method Ce 8-89 on an Agilent 1100 HPLC system fitted with a 250×4 mm Lycoshere Si 60 (5 um) analytical column and a G1321A fluorescence detector. Oil stocks, as described above, without internal standard were used for this analysis. Quantitative standards dissolved in heptane, were prepared with authentic α (alpha), β (beta), γ (gamma) and δ (delta) tocopherol standards (Supelco, Bellefonte Pa., USA). Standard concentrations were confirmed by UV-spectroscopy using the following wavelengths and extinction coefficients [α (alpha), OD292, 0.0076; β (beta) OD296, 0.0089; γ (gamma) OD298, 0.0091: δ (delta) OD298, 0.0087].

Oil Quality and Oxidative Stability Measurements

Free Fatty Acid Content

Free fatty acid contents of the oils were performed by titration using a Mettler-Toledo DL22 F&B titrator (Mettler-Toledo, Columbus Ohio, USA) according to the manufacturers protocol M345 (Acid Number of edible oils).

Peroxide Value

Peroxide values of the oils were performed by iodometric titration using a Mettler-Toledo DL22 F&B titrator (Mettler-Toledo, Columbus Ohio, USA) according to the manufacturers protocol M346 (Peroxide value in edible oils and fats).

p-Anisidine Value p-Anisidine values were determined on oils according to AOCS official method Cd 18-90.

Oxidative Stability Index

The oxidative stability index was measured on 5.0+/−0.2 g samples of pure oil samples (with or without additives) according to AOCS official method Cd 12b-92, using an OSI-24 Oxidative Stability Instrument. Instrument control and data analysis were performed using OSI Program v8.18 and Instacal 5.33 software (Omnion, Inc, Rockland Mass., USA).

TABLE 1

Fatty acid profiles of some soy oils

| | 16:0 % | 18:0 % | 18:1 % | 18:2 % | 18:3 % | % Total poly-unsaturates |
|---|---|---|---|---|---|---|
| Commodity Soy Oil[1] | 8-13 | 2-6 | 18-27 | 51-59 | 6-10 | 57-69 |
| E1, an example of the range of High Oleic Soy Oils for use according to the invention | 6-7 | 4-5 | 70-86 | 2-13 | 2-3 | 4-16 |

For this table, fatty acid % relates the individual fatty acid to the sum of the five major or fatty acids indicated. Other fatty acid types that are sometimes present and represent less than 3% of the total fatty acids are not considered for purposes of comparison
[1]Value ranges for the five major fatty acids in commodity soy oil are taken from "The Lipid Handbook" 2nd ed., (1994) Gunstone, F. D., Harwood, J. L., Padley, F. B., Chapman & Hall.
16:0 = palmitic acid,
18:0 = stearic acid,
18:1 = oleic acid,
18:2 = linoleic acid,
18:3 = linolenic acid Example 6

Dielectric Loss

The loss factor (Df) was measured using ASTM D924 for the dielectric heat-transfer fluids shown in Table 2, at different temperatures. Loss factor was plotted VS temperature.

Figure 1:
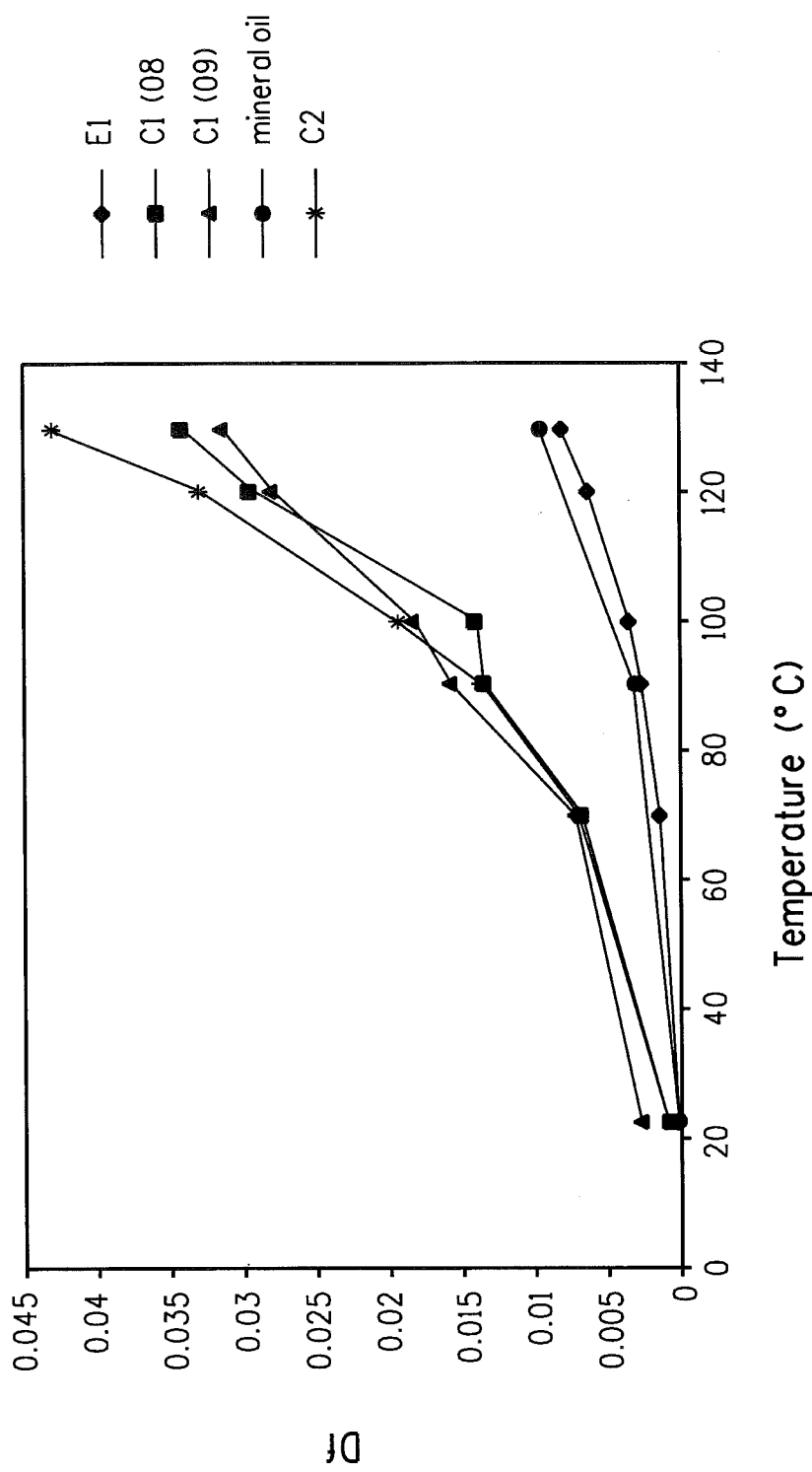

The results are shown in FIG. 1, wherein the squares ■ and triangles ▲ show the loss factor for comparative fluid C1 (measured at two different times), the crosses X show the loss factor for comparative fluid C2, the diamonds ♦ show the loss factor for a soybean oil for use according to the invention E1, and the filled circles ● show the loss factor for mineral oil, which is included as a reference.

TABLE 2

Dielectric heat-transfer fluids used for experiments

| Reference | Fluid | Fatty acid composition % | | | | | Tocopherol content mg/100 g oil |
|---|---|---|---|---|---|---|---|
| | | C16:0 | C18:0 | C18:1 | C18:2 | C18:3 | |
| C1 | Envirotemp ® FR3 ™ fluid (soy oil) (Cooper Industries, Inc.) | 10 | 4 | 23-48 | 34-54 | 1-8 | 140 |
| C2 | BIOTEMP ® (sunflower) Biodegradable Dielectric Insulating Fluid (ABB, Inc.) | | (Total saturates) 3-8 | 84-85 | 10-12 | 0-3 | 46 |
| E1 | One of the soybean oil s (fluid for the use of the invention) | 6.15 | 3.85 | 77.74 | 4.20 | 2.19 | 97 mg/100 ml |

TABLE 3

Detailed fatty acid composition of dielectric heat-transfer fluid E1 used for experiments

| Fatty acid | % |
|---|---|
| C14:0 (myristic) | 0.04 |
| C15:0 (pentadecanoic) | 0.03 |
| C16:0 (palmitic) | 6.15 |
| C16:1 n-7 (palmitoleic) | 0.10 |
| C17:0 (margaric) | 0.81 |
| C18:0 (stearic) | 3.85 |
| C18:1 n-9 (oleic) | 77.74 |
| C18:1 (octadecenoic), | 1.30 |
| C18:2 n-6 (linoleic) | 4.20 |
| C18:3 n-3 (alpha-linoleic) | 2.19 |
| Total polyunsaturates | 0.39 |
| C20:0 (arachidic) | 0.38 |
| C20:1 n-9 (eicosenoic) | 0.40 |
| C20:1 n-9 (eicosadienoic) | 6.79 |
| C22:0 (behenic) | 0.01 |
| C24:0 (lignoceric) | 0.16 |
| Others | 0.00 |

It is clear from FIG. 1 that the soybean oil for use according to the invention (E1) shows a low dielectric loss factor that stays relatively consistent with increase in temperature, whereas the other vegetable oils (C1 and C2) show significant increases in loss factor as the temperature is increased.

The results are shown in tabular form in Table 4.

TABLE 4

Df for oil E1 at various temperatures

| Temperature (° C.) | Df |
|---|---|
| 23 | $2 \times 10^{-4}$ |
| 70 | $1.4 \times 10^{-3}$ |
| 90 | $2.7 \times 10^{-3}$ |
| 100 | $3.6 \times 10^{-3}$ |
| 120 | $6.5 \times 10^{-3}$ |
| 130 | $8.1 \times 10^{-3}$ |

Example 7

Breakdown Voltage

The dielectric breakdown voltage is an essential parameter to compare fluids used for dielectric insulation and/or heat exchange in the presence of electrical and magnetic fields. It is also a relevant indication of the arcing transmission characteristics of the fluid.

The dielectric breakdown voltage, measured according to ASTM D877, characterises the dielectric performance limit of the fluid, which is a bulk property giving indirect access to the ultimate voltage under which the dielectric can be used and its ability to sustain eventual voltage pulses.

The soy oil for use according to the invention (E1) has a breakdown voltage at 23° C. within the range of 57 to 66 kV. In contrast, the two comparative fluids C1 and C2 have breakdown voltages in the range of 47 to 65 kV at 25° C. i.e. significantly broader and lower. The fluid for use according to the invention (E1) is clearly superior, exhibiting better consistency versus arcing transmission as well.

Example 8

Pre-Treatment Method

The fluid for the use according to the invention (E1) as well as the two comparative fluids (C1 and C2) of a mass of 2.6 g were exposed to a commercial microwave treatment of one minute at a maximum power of 900 W. Such conditions were selected to yield a fluid temperature inferior to 200° C. and preferably lower than 160° C. in order to maintain the molecular integrity of the essential components of the fluid.

Example 9

Differential Scanning Calorimetry and Thermogravimetric Analysis

In order to demonstrate the benefit of the pre-treatment method by electromagnetic microwave exposure (Example 8), various vegetable dielectric heat-transfer fluids were subjected to differential scanning calorimetry coupled with thermogravimetric analysis, both with and without the pre-treatment.

Specific conditions and equipment references are provided below:

Equipment: 2960 SDT-CE5275 Ta Instrument (simultaneously performing DSC-TGA—differential scanning calorimetric and thermogravimetric analysis)
Test Conditions:
10° C./min till 650[° C.]
air flow: 100 ml/min
air composition
$N_2$: 78.09%
$O_2$: 20.95%
Ar 0.93%
$CO_2$: 0.03

Figure 2:
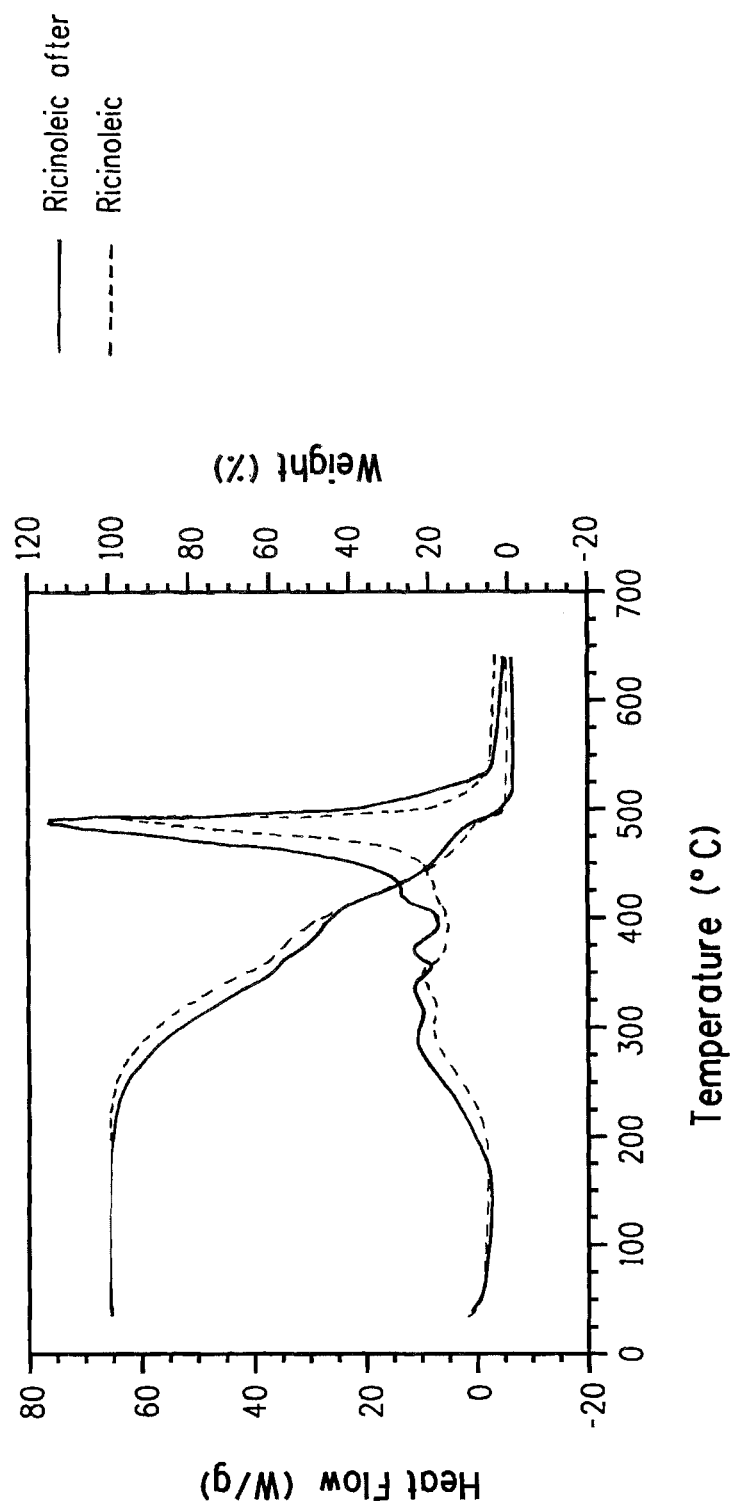
FIG. 2 shows the thermo-gravimetric pattern and heat flux generated before (dotted lines) and after (solid lines) a pharmaceutical grade of Ricinoleic oil is exposed to the electromagnetic microwave treatment of Example 8.

FIG. 2 shows the thermo-gravimetric pattern and heat flux generated before (dotted lines) and after (solid lines) a pharmaceutical grade of Ricinoleic oil is exposed to the electromagnetic microwave treatment of Example 8.

The heat flux signal definition and their relative strength clearly show a beneficial preconditioning of the oil by the electromagnetic microwave treatment process and method therewith, as is shown for example by the sharpness of the peaks, the start and the onset temperatures after the pre-treatment.

Figure 3:
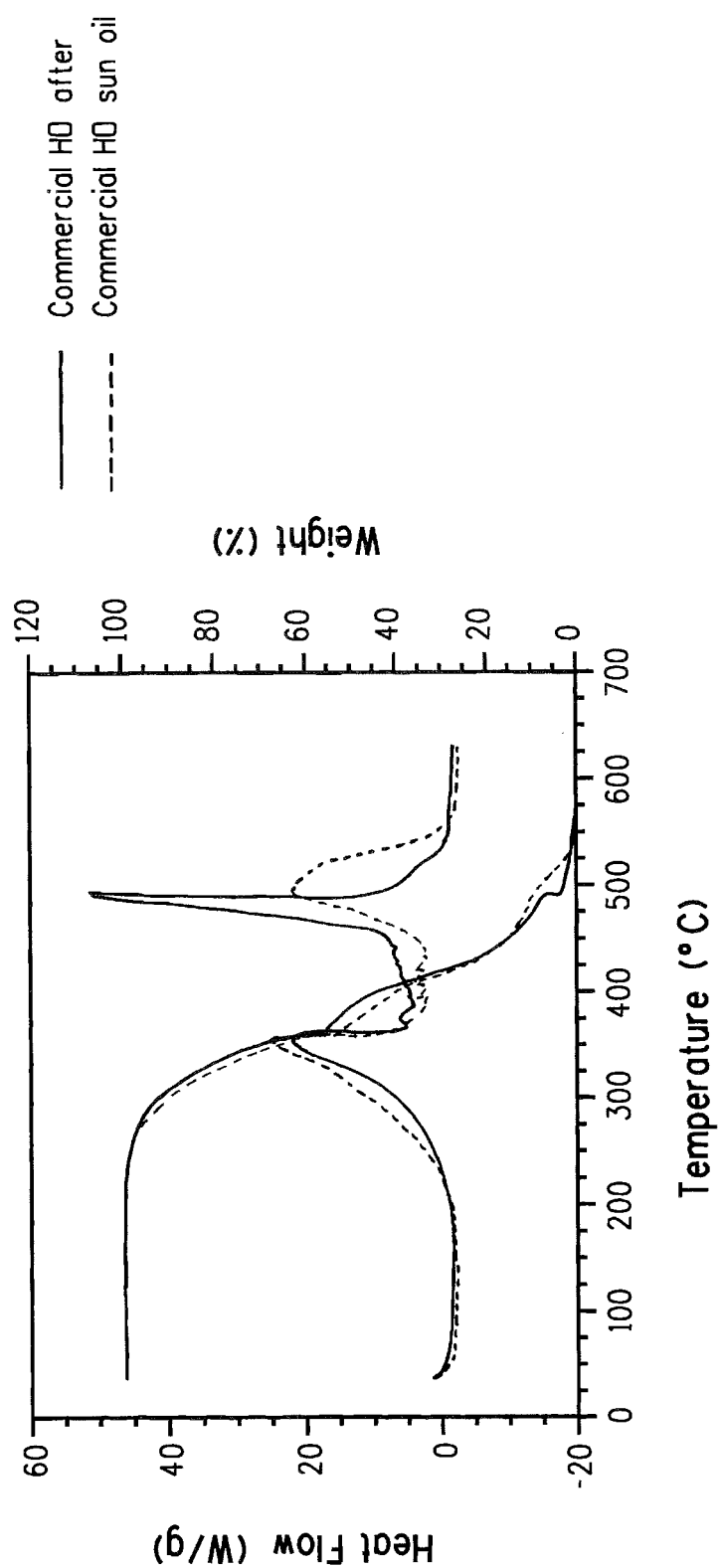
FIG. 3 shows the thermo-gravimetric pattern and heat flux generated before (dotted lines) and after (solid lines) a commercial grade of High Oleic Sunflower oil, the comparative fluid C2, is exposed to the electromagnetic microwave treatment of Example 8.

FIG. 3 shows the thermo-gravimetric pattern and heat flux generated before (dotted lines) and after (solid lines) a commercial grade of High Oleic Sunflower oil, the comparative fluid C2, is exposed to the electromagnetic microwave treatment of Example 8.

The heat flux signal definition and their relative strength clearly show a beneficial preconditioning of the oil by the electromagnetic microwave treatment process and method therewith, as is shown by the sharpness of the peaks after the pre-treatment.

Figure 4:
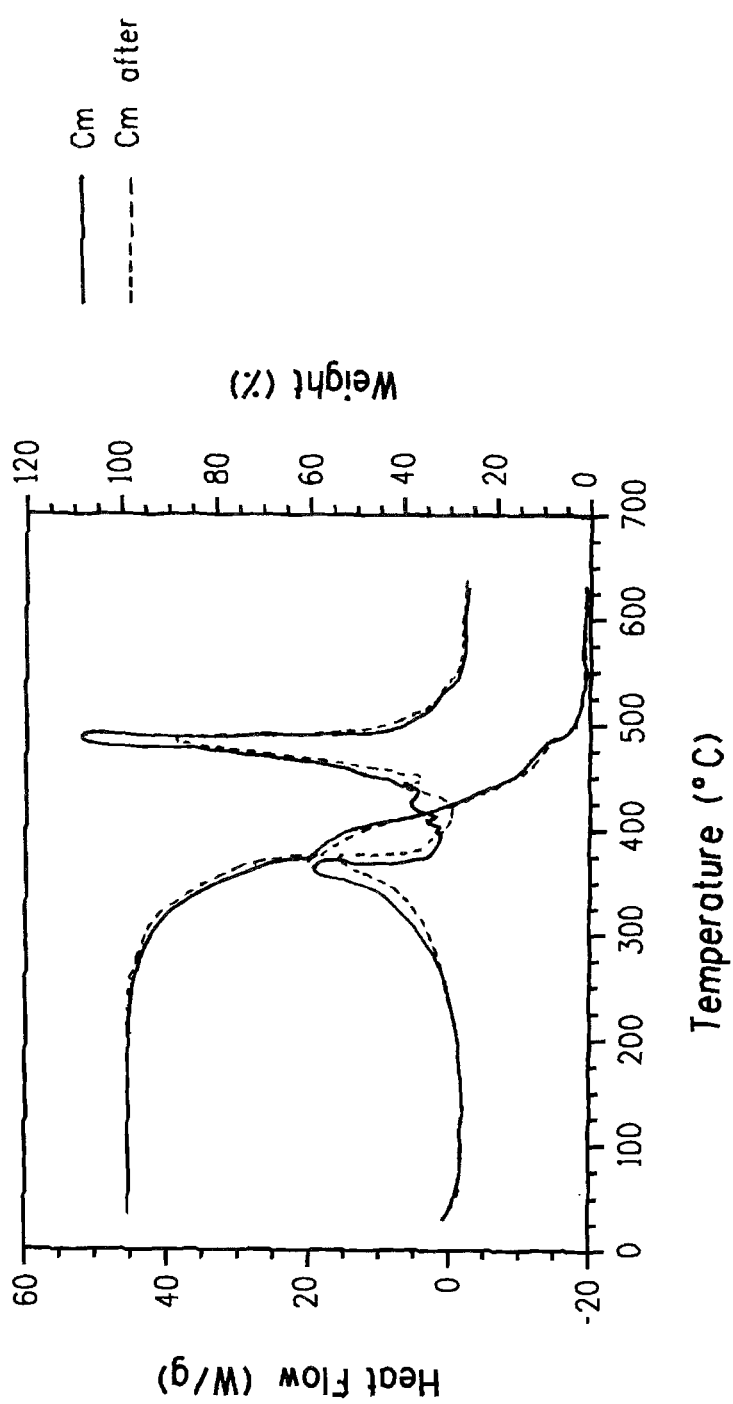
FIG. 4 shows the thermo-gravimetric pattern and heat flux generated before (solid lines) and after (dotted lines) a commercial grade of normal soybean oil, the comparative fluid C1, was exposed to the electromagnetic microwave treatment of Example 8.

FIG. 4 shows the thermo-gravimetric pattern and heat flux generated before (solid lines) and after (dotted lines) a commercial grade of normal soybean oil, the comparative fluid C1, was exposed to the electromagnetic microwave treatment of Example 8.

The heat flux signal definition and their relative strength clearly show a beneficial preconditioning of the oil by the electromagnetic microwave treatment process and method therewith, as is shown by the sharpness of the peaks after the pre-treatment.

Figure 5:
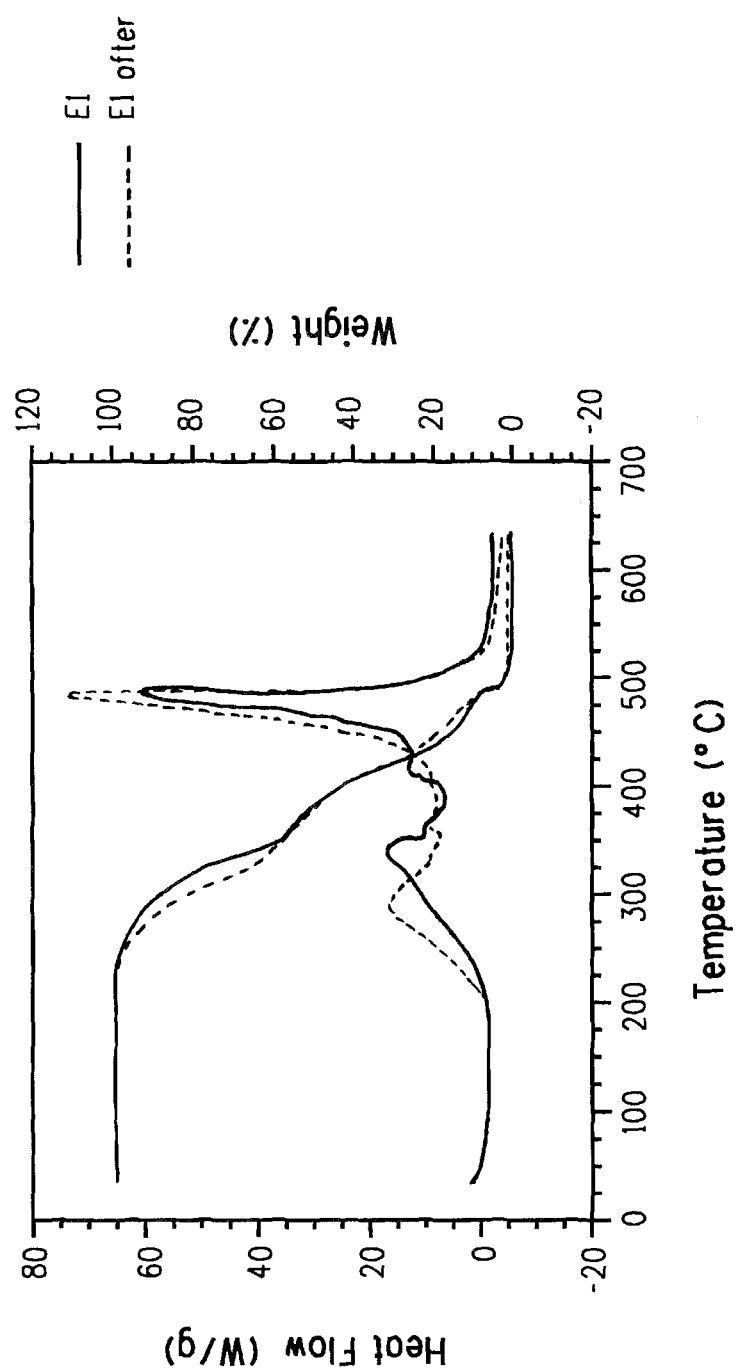
FIG. 5 shows the thermo-gravimetric pattern and heat flux generated before (solid lines) and after (dotted lines) the fluid for the use of the invention, E1, was exposed to the electromagnetic microwave treatment of Example 8.

FIG. 5 shows the thermo-gravimetric pattern and heat flux generated before (solid lines) and after (dotted lines) the fluid for the use of the invention, E1, was exposed to the electromagnetic microwave treatment of Example 8.

The heat flux signal definition and their relative strength clearly show a beneficial preconditioning of the oil by the electromagnetic microwave treatment process and method therewith, as is shown by the sharpness of the peaks after the pre-treatment.

Note: the beneficial effect of the pre-treatment extends to all triacylglycerol dielectric heat-transfer fluids and mixtures thereof, and is not limited to the fluid used in the use according to the invention.

Example 10

Behaviour of Dielectric Heat-Transfer Fluid with Dielectric Paper

Commercially available transformer insulation Kraft paper, from Weidmann AG, Rapperswill, Switzerland, was impregnated at room temperature, via a naturally occurring imbibing process, with an amount equivalent to 30 wt % of the fluid for use according to the invention. The initial specific weight of the paper was 95 $g/m^2$.

One sample of such imbibed paper was subjected to the microwave pre-treatment method of Example 8, and a second was not.

Figure 6:
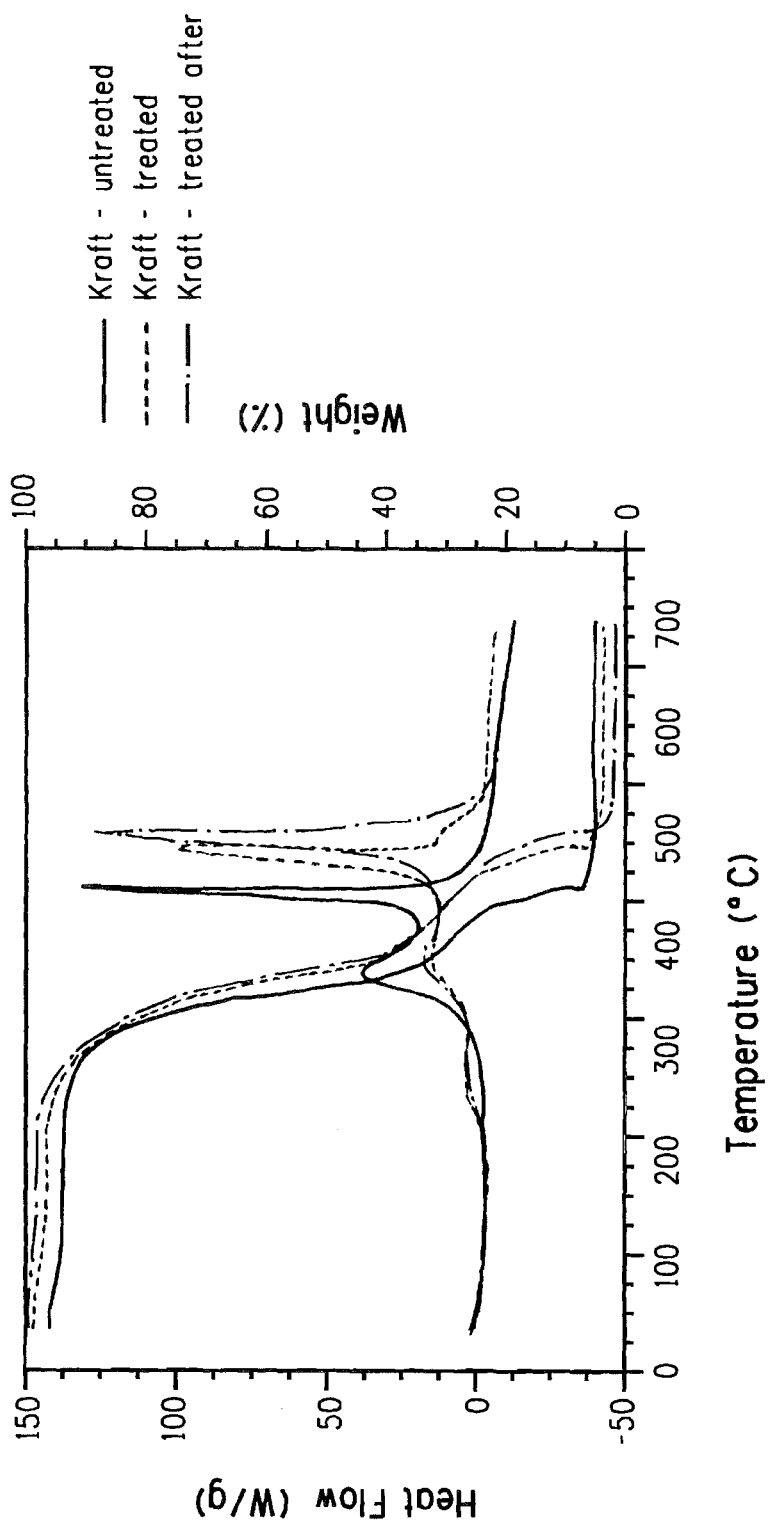
FIG. 6 shows the thermal behaviour of untreated Kraft paper (solid line), Kraft paper imbibed with the fluid for use according to the invention (dotted lines) and Kraft paper imbibed with the fluid for use according to the invention and pre-treated with microwaves according to Example 8 (dash-dot lines).

FIG. 6 shows the thermal behaviour of untreated Kraft paper (solid line), Kraft paper imbibed with the fluid for use according to the invention (dotted lines) and Kraft paper imbibed with the fluid for use according to the invention and pre-treated with microwaves according to Example 8 (dash-dot lines).

The imbibing of the Kraft paper with the fluid for use according to the invention results in an enhancement of the thermal resistance of the paper by 20-40° C. The microwave pre-treatment results in a further enhancement by 10° C.

The impregnation can be done during the manufacture of the paper or after. The microwave treatment can be repeated as many times as needed and can be performed by exposing said fluid to a constant and uniformly distributed electromagnetic field applied continuously or in series of constant and/or variable pulse and relaxation sequences; repeating the exposure sequence as often as needed. Inventor found for example that the exposure of 7.2 g of oil of the invention to 20 cycles of 10 s 300 W-microwave pulse and 50 s relaxation were effective in preconditioning the oil without causing damage that may be provoked by prolonged higher-microwave-power exposure.

The imbibing oil can be any oil mixtures of the invention. An oil of the invention mixed with 20% of a commodity linseed oil has surprisingly shown good sealing properties that are especially valuable in sealed electrical devices of the invention, especially transformers, which tend to micro-leak with time, especially for those used for relatively long period of time, such as 20 to 30 years. The sealing nature of the oil of the blends of the invention is especially appreciated. Naturally occurring or synthesised epoxidized vegetable oil have also been found as exhibiting similar sealing effect of the insulating paper as well as at sealing interfaces.

The paper treatment with the oil of the invention and/or mixtures thereof, has valuable effect on the viscoelastic behaviour of the paper and its mechanical resistance to puncture and tearing, for example; leading to enhance paper endurance appreciated to extend the life of the electrical device, such as liquid filled transformers.

Example 12

It was found that under moderate ageing (88 hours at 170° C. in an air ventilated oven) the dynamic viscosity of a conventional commodity soy oil having about 21% mono-unsaturated C18/1, increased irreversibly from 60 to 180 mPa·s as measured at 23° C. Furthermore, the conventional oil showed a strong colour change from a pale yellow to a rosewood colour. This represents a 3× increase in dynamic viscosity over a relatively short period of time. Such an increase in dynamic viscosity could lead to a 25% adjustment need of the circulated volume and pressure drop compensation within a transformer.

An oil for use according to the invention, E1, was subjected to the same heat aging, and no change in dynamic viscosity was observed.

This kind property makes the oil particularly useful as a dielectric heat-transfer fluid.

Example 13

An experiment was done to determine the effect of oleic acid content on Df vs temperature behaviour.

A given amount of a low linoleic soy oil (LL) having the fatty acid composition ("FAC") profile given in Table 6 was blended with an oil for the use of the invention, E4, of the profile given in Table 6 to produce blended oils corresponding to 70% and 65% oleic acid oil mixtures of the FAC profile given in Table 6. A commodity soy oil sample (Cm) of the FAC profile given in Table 6 served as a representative of a lower oleic oil content sample.

TABLE 6

FAC of various soy oils and blended soil oils used for Example 13.

| FAC, Relative % | E2 | E4 | 70% oleic | 65% oleic | LL | Cm |
|---|---|---|---|---|---|---|
| C14 (Myristic) | 0.04 | 0.04 | 0.04 | 0.05 | 0.07 | 0.07 |
| C15 (Pentadecanoic) | 0.03 | 0.03 | 0.03 | 0.03 | 0.02 | 0.02 |
| C16 (Palmitic) | 6.15 | 6.26 | 6.68 | 7.12 | 10.37 | 10.27 |
| C16:1n7 (Palmitoleic) | 0.10 | 0.09 | 0.08 | 0.09 | 0.1 | 0.09 |

TABLE 6-continued

FAC of various soy oils and blended soil oils used for Example 13.

| FAC, Relative % | E2 | E4 | 70% oleic | 65% oleic | LL | Cm |
|---|---|---|---|---|---|---|
| C17 (Margaric) | 0.81 | 0.74 | 0.7 | 0.64 | 0.11 | 0.10 |
| C17:1 | 1.35 | 0.01 | 1.06 | 0.96 | 0.07 | 0.06 |
| C18 (Stearic) | 3.85 | 3.94 | 4.09 | 4.19 | 4.77 | 4.59 |
| C18:1n9 (Oleic) | 77.74 | 74.36 | 69.24 | 64.53 | 20.96 | 21.29 |
| C18:1 Octadecenoic | 1.30 | 1.17 | 0.89 | 0.9 | 1.44 | 1.43 |
| C18:2n6 (Linoleic) | 4.20 | 8.7 | 12.74 | 17.06 | 57.01 | 53.46 |
| C18:3n3 (aloha-Linolenic) | 2.19 | 2.92 | 2.82 | 2.85 | 3.02 | 7.21 |
| C20 (Arachidic) | 0.39 | 0.37 | 0.37 | 0.36 | 0.35 | 0.35 |
| C20:1n9 (Eicosenoic) | 0.38 | 0.29 | 0.27 | 0.26 | 0.17 | 0.19 |
| C20:2n6 Eicosadienoic | 0.40 | 0.35 | 0.35 | 0.35 | 0.37 | 0.36 |
| Total polyunsaturates | 6.79 | 11.97 | 15.91 | 20.26 | 60.4 | 61.03 |
| C22 (Behenic) | 0.01 | 0.0 | 0 | 0 | 0.01 | 0.37 |
| C24 (Lignoceric) | 0.16 | 0.10 | 0.07 | 0.07 | 0.1 | 0.13 |
| C24:1 | 0.00 | 0 | 0 | 0 | 0 | 0 |
| Other | 0.90 | 0.63 | 0.57 | 0.54 | 1.06 | 0.01 |

Samples of the oils and blends listed in Table 6 were submitted to the Df analysis as described in Example 6, measuring Df as a function of temperature, at temperatures ranging from 23 to 130° C.

FIGS. 7A and 7B show the variation of Df as a function of temperature for the oils and blended oils listed in Table 6. FIG. 7A shows oils of the invention comprising 78% oleic acid (E2) compared to commodity oil and a 65% oleic acid blend and a 70% oleic acid blend. FIG. 7B shows oils of the invention comprising a 74% oleic acid content (E4) compared to commodity oil and a 65% oleic acid blend and a 70% oleic acid blend. In FIG. 7A the squares designate the results for E2 ("HOSO"), having 77.74% oleic acid.

The X; s in FIG. 7B designate the results for E4, having 74.36% oleic (74%);

The asterisks in Figures A and B designate the results for the commodity soy oil (Cm) having 21% oleic acid and 61% polyunsaturates.

The triangles designate the results for a soy oil blend having 70% oleic and 16% polyunsaturates in FIGS. 7A and 7B.

The diamonds designate the results for a soy oil blend having 65% oleic and 20% polyunsaturates in FIGS. 7A and 7B.

It is clear from FIGS. 7A and 7B that the oils for use according to the invention E1 show superior behaviour over the other oils, in that the Df is lower and stays lower over the entire temperature range of 23-130° C. Furthermore, the oils of the invention E1, such as for example the 70% oleic acid blend, the oil E2 and oil E4 show less increase in Df with temperature.

The commodity soy oil Cm without antioxidants and other additives responds similarly to the commercial soy oil C1 containing traditional additives for the transformer applications.

FIG. 8 shows the variation of Df as a function of the oleic content in percent, at two temperatures (130° C., upper line, and 90° C., lower line). It can be seen from FIG. 8 that at both temperatures the Df drops as the oleic acid content increases, with a sharp decrease from at or about 65% oleic acid to at or about 70% oleic acid. The oil used for this experiment was oil E2 as an example for one of the oils of the invention.

Example 14

An additional experiment was done to measure Df as a function of temperature (according to Example 6) using two different soy oils for use according to the invention, E2 and E4, as compared with high oleic sunflower oil (84% oleic acid, 8% total polyunsaturates), and oils C1 and C2. The FAC of the oils is listed in Table 7.

TABLE 7

FAC of oils used in experiments of Example 14

| Oil | E2 | E4 | High Oleic Sunflower | C1 | C2 |
|---|---|---|---|---|---|
| FAC, Relative % | | | | | |
| C14 (Myristic) | 0.04 | 0.04 | 0.03 | 0.07 | 0.04 |
| C15 (Pentadecanoic) | 0.03 | 0.03 | 0.01 | 0.02 | 0.01 |
| C16 (Palmitic) | 6.15 | 6.26 | 2.97 | 10.57 | 3.59 |
| C16:1n7 (Palmitoleic) | 0.10 | 0.09 | 0.07 | 0.09 | 0.09 |
| C17 (Margaric) | 0.81 | 0.74 | 0.03 | 0.10 | 0.03 |
| C17:1 | 1.35 | 0.01 | 0.06 | 0.06 | 0.05 |
| C18 (Stearic) | 3.85 | 3.94 | 2.95 | 4.35 | 2.93 |
| C18:1n9 (Oleic) | 77.74 | 74.36 | 84.21 | 21.38 | 83.81 |
| C18:1 Octadecenoic | 1.30 | 1.17 | 0.59 | 1.44 | 0.23 |
| C18:2n6 (Linoleic) | 4.20 | 8.70 | 7.15 | 53.68 | 7.19 |
| C18:3n3 (alpha-Linolenic) | 2.19 | 2.92 | 0.10 | 7.21 | 0.17 |
| C20 (Arachidic) | 0.39 | 0.37 | 0.26 | 0.33 | 0.27 |
| C20:1n9 (Eicosenoic) | 0.38 | 0.29 | 0.29 | 0.18 | 0.27 |
| C22 (Behenic) | 0.4 | 0.35 | 0.88 | 0.01 | 0.82 |
| C24 (Lignoceric) | 0.16 | 0.10 | 0.30 | 0.02 | 0.04 |
| C24:1 | 0.00 | 0.00 | 0.02 | 0.00 | 0.00 |
| Other | 0.91 | 0.63 | 0.08 | 0.49 | 0.46 |

The Df was measured at various temperatures according to Example 6. The results are listed in Table 8. The results clearly show that oils E2 and E4, which are soy oils for use according to the invention, show significantly lower Df's over the temperature range of 23-130° C., and show less increase in Df at high temperatures than the comparative oils. The high oleic sunflower Df data are locally just in between E4 and C1, close to C1 indicating a significant variation of the high oleic sunflower Df values within the 23 to 130 C temperature range. The high oleic sunflower without antioxidants and other additives responds similarly to the commercial high oleic sunflower C2 containing traditional additives for the transformer applications.

TABLE 8

Df for oils at various temperatures

| Temp | C1 | C2 | E2 | E4 | High oleic sunflower |
|---|---|---|---|---|---|
| 23 | 0.0016 | 0.0007 | 0.0002 | 0.0018 | 0.0003 |
| 70 | 0.0081 | 0.0085 | 0.0014 | 0.0021 | 0.006 |
| 90 | 0.0146 | 0.0166 | 0.0027 | 0.0044 | 0.016 |
| 100 | 0.0201 | 0.0208 | 0.0036 | 0.0059 | 0.0154 |
| 120 | 0.0287 | 0.0372 | 0.0065 | 0.0128 | 0.0296 |
| 130 | 0.0402 | 0.0524 | 0.0081 | 0.0186 | 0.0302 |

FIG. 9 shows in graphic form the dielectric loss factor (Df) VS temperature for comparative fluids C1 and C2 and for oils E2 and E4, wherein the squares ■ show the loss factor for comparative fluid C1, the open triangles ▲ show the loss factor for comparative fluid C2, the diamonds ♦ show the loss factor for a soybean oil for use according to the invention E2 and E4, lower line E2, upper line E4.

What is claimed is:

1. A method comprising introducing a soy oil into a device to generate, store, convert and/or distribute electrical energy, wherein the soy oil is one in which at least 70% of the fatty acids are C14 to C22 mono-unsaturated fatty acids, less than 16% of the fatty acids are polyunsaturated fatty acids, and further wherein the oil comprises naturally occurring tocopherol antioxidants at a concentration of at least 85 mg/100 g of oil and wherein the Df value, at a constant temperature, of the oil is improved when compared to a comparable soy oil not comprising at least 70% C14 to C22 mono-unsaturated fatty acids, less than 16% polyunsaturated fatty acids and at least 85 mg naturally occurring tocopherol antioxidants/100 g of oil.

2. The method of claim 1, wherein the device comprises an organic fibrous structure impregnated with the soy oil.

3. The method of claim 1 or 2, wherein the soy oil has at least 80% content of monounsaturated $C_{14}$ to $C_{22}$ fatty acids.

4. The method of claim 1 or 2, wherein the soy oil has a saturated fatty acid content of less than or about 12%.

5. The method of claim 1 or 2, wherein the soy oil has less than 6% of polyunsaturated fatty acids.

6. The method of claim 1 or 2, wherein the C14 to C22 monounsaturated fatty acids are oleic acid.

7. The method of claim 1 or 2, wherein the polyunsaturated fatty acids are $C_{18}$ fatty acids having two or three double bonds.

8. The method of claim 1 or 2, wherein the soy oil has the following fatty acid content: at or about 6% C16:0, 3% C18:0, 86% C18:1, 2% C18:2 and 2% C18:3.

9. The method of claim 1 or 2, wherein the soy oil has the following fatty acid content: at or about 6% C16:0, 4% C18:0, 79% C18:1, 4% C18:2, 2% C18:3.

10. The method of claim 1 or 2, wherein the soy oil has the following fatty acid content: at or about 6% C16:0, 4% C18:0, 74% C18:1, 9% C18:2, 3% C18:3.

11. The method of claim 1 or 2, wherein the soy oil has the following fatty acid content: at or about 6% C16:0, 4% C18:0, 78% C18:1, 4% C18:2, 2% C18:3.

12. The method of claim 1 or 2, wherein the soy oil is derived from a seed plant that has been genetically manipulated to increase expression of the gene encoding oleoyl 12-desaturase, compared to a comparable seed plant not genetically manipulated to increase expression of the gene encoding oleoyl 12-desaturase.

13. The method of claim 1 or 2, wherein the content of C18:2 is less than or about 7%.

14. A method of reducing dielectric loss of a heat-transfer fluid comprising introducing a soy oil into a device to generate, store, convert and/or distribute electrical energy, wherein the soy oil is one in which at least 70% of the fatty acids are C14 to C22 mono-unsaturated, less than 16% of the fatty acids are polyunsaturated, and further wherein the oil comprises naturally occurring tocopherol antioxidants at a concentration of at least 85 mg/100 g of oil and wherein the Df value, at a constant temperature, of the oil is improved when compared to a comparable soy oil not comprising at least 70% C14 to C22 mono-unsaturated fatty acids, less than 16% polyunsaturated fatty acids and at least 85 mg naturally occurring tocopherol antioxidants/100 g of oil.

15. The method of claim 1, wherein the soy oil comprises about 75% oleic acid.

16. The method of claim 1, wherein the soy oil comprises about 74% oleic acid.

17. The method of claim 1, wherein the soy oil comprises about 70% oleic acid.

18. The method of claim 14, wherein the soy oil comprises about 75% oleic acid.

19. The method of claim 14, wherein the soy oil comprises about 74% oleic acid.

20. The method of claim 14, wherein the soy oil comprises about 70% oleic acid.

21. The method of claim 1, further comprising generating, storing, converting or distributing electrical energy in the device.

22. The method of claim 14, further comprising generating, storing, converting or distributing electrical energy in the device.

23. A method for generating, storing, converting or distributing electrical energy, the method comprising generating, storing, converting or distributing electrical energy in a device comprising a soy oil, the soy oil being one in which at least 70% of the fatty acids are C14 to C22 mono-unsaturated fatty acids, less than 16% of the fatty acids are polyunsaturated fatty acids, and comprising naturally occurring tocopherol antioxidants at a concentration of at least 85 mg/100 g of oil and wherein the Df value, at a constant temperature, of the oil is improved when compared to a comparable soy oil not comprising at least 70% C14 to C22 mono-unsaturated fatty acids, less than 16% polyunsaturated fatty acids and at least 85 mg naturally occurring tocopherol antioxidants/100 g of oil.

24. The method of claim 23, wherein the device comprises an organic fibrous structure impregnated with the soy oil.

* * * * *

SEQUENCE LISTING

```
<160> NUMBER OF SEQ ID NOS: 4

<210> SEQ ID NO 1
<211> LENGTH: 2924
<212> TYPE: DNA
<213> ORGANISM: artificial sequence
<220> FEATURE:
<223> OTHER INFORMATION: fragment PHP19340A
<220> FEATURE:
<221> NAME/KEY: misc_feature
<222> LOCATION: (1191)..(1191)
<223> OTHER INFORMATION: n is a, c, g, or t

<400> SEQUENCE: 1
cgcgccaagc ttggatcctc gaagagaagg gttaataaca cactttttta acatttttaa      60
cacaaatttt agttatttaa aaatttatta aaaaatttaa aataagaaga ggaactcttt     120
aaataaatct aacttacaaa atttatgatt tttaataagt tttcaccaat aaaaaatgtc     180
ataaaaatat gttaaaaagt atattatcaa tattctcttt atgataaata aaagaaaaa     240 aaaaataaaa gttaagtgaa aatgagattg aagtgacttt aggtgtgtat aaatatatca     300
accccgccaa caatttattt aatccaaata tattgaagta tattattcca tagcctttat     360
ttatttatat atttattata taaaagcttt atttgttcta ggttgttcat gaaatatttt     420
tttggtttta tctccgttgt aagaaaatca tgtgctttgt gtcgccactc actattgcag    480
```

```
cttttttcatg cattggtcag attgacggtt gattgtattt ttgtttttta tggttttgtg    540
ttatgactta agtcttcatc tcttatctc ttcatcaggt ttgatggtta cctaatatgg      600
tccatgggta catgcatggt taaattaggt ggccaacttt gttgtgaacg atagaatttt     660
ttttatatta agtaaactat ttttatatta tgaaataata ataaaaaaaa tattttatca     720
ttattaacaa aatcatatta gttaatttgt taactctata ataaagaaa tactgtaaca      780 ttcacattac atggtaacat cttttccaccc tttcatttgt tttttgtttg atgacttttt    840
ttcttgttta aatttatttc ccttcttttta aatttggaat acattatcat catatataaa    900
ctaaaatact aaaaacagga ttacacaaat gataaataat aacacaaata tttataaatc     960
tagctgcaat atatttaaac tagctatatc gatattgtaa aataaaacta gctgcattga    1020
tactgataaa aaaatatcat gtgctttctg gactgatgat gcagtatact tttgacattg    1080
cctttatttt attttttcaga aaagcttttct tagttctggg ttcttcatta tttgtttccc   1140
atctccattg tgaattgaat catttgcttc gtgtcacaaa tacaatttag ntaggtacat    1200
gcattggtca gattcacggt ttattatgtc atgacttaag ttcatggtag tacattacct    1260
gccacgcatg cattatattg gttagatttg ataggcaaat ttggttgtca acaatataaa    1320
tataaataat gttttatat tacgaaataa cagtgatcaa aacaaacagt tttatcttta    1380
ttaacaagat tttgttttttg tttgatgacg ttttttaatg tttacgcttt ccccttctt    1440 ttgaatttag aacactttat catcataaaa tcaaatacta aaaaaattac atatttcata    1500
aataataaca caatatttt taaaaaatct gaaataataa tgaacaatat tacatattat    1560
cacgaaaatt cattaataaa aatattatat aaataaaatg taatagtagt tatatgtagg    1620
aaaaaagtac tgcacgcata atatatacaa aaagattaaa atgaactatt ataaataata    1680
acactaaatt aatggtgaat catatcaaaa taatgaaaaa gtaaataaaa tttgtaatta    1740
acttctatat gtattacaca cacaaataat aaataatagt aaaaaaaatt atgataaata    1800
tttaccatct cataagatat ttaaaataat gataaaaata tagattattt tttatgcaac    1860
tagctagcca aaaagagaac acgggtatat ataaaaagag taccttaaa ttctactgta    1920 cttcctttat tcctgacgtt tttatatcaa gtggacatac gtgaagattt taattatcag    1980
tctaaatatt tcattagcac ttaatactt tctgttttat tcctatccta taagtagtcc    2040
cgattctccc aacattgctt attcacacaa ctaactaaga aagtcttcca tagccccca    2100 agcggccgct gagtgattgc tcacgagtgt ggtcaccatg ccttcagcaa gtaccaatgg    2160
gttgatgatg ttgtgggttt gacccttcac tcaacacttt tagtccctta tttctcatgg    2220
aaaataagcc atcgccgcca tcactccaac acaggttccc ttgaccgtga tgaagtgttt    2280
gtcccaaaac caaaatccaa agttgcatgg ttttccaagt acttaaacaa ccctctagga    2340
agggctgttt ctcttctcgt cacactcaca ataggggtgc ctatgtattt agccttcaat    2400
gtctctggta gaccctatga tagttttgca agccactacc cccttatgc tcccatatat    2460 tctaaccgtg agaggcttct gatctatgtc tctgatgttg ctttgttttc tgtgacttac    2520
tctctctacc gtgttgcaac cctgaaaggg ttggtttggc tgctatgtgt ttatggggtg    2580
cctttgctca ttgtgaacgg ttttcttgtg actatcacat atttgcagca cacacacttt    2640
gccttgcctc attacgattc atcagaatgg gactggctga agggagcttt ggcaactatg    2700
gacagagatt aagcggccgc gacacaagtg tgagagtact aaataaatgc tttggttgta    2760
cgaaatcatt acactaaata aaataatcaa agcttatata tgccttccgc taaggccgaa    2820
```

```
tgcaaagaaa ttggttctttt ctcgttatct tttgccactt ttactagtac gtattaatta    2880
ctacttaatc atctttgttt acggctcatt atatccgtcg acgg                      2924

<210> SEQ ID NO 2
<211> LENGTH: 4511
<212> TYPE: DNA
<213> ORGANISM: artificial sequence
<220> FEATURE:
<223> OTHER INFORMATION: fragment PHP17752

<400> SEQUENCE: 2
cgcgccaagc ttggatcccc cctcgaggtc gacggtatcg ataagcttct gcaggaattc      60
tgagctagcg aagttcctat tccgaagttc ctattcttca aaagtatag gaacttcaga      120 cgtcctcgag tccgtcctgt agaaacccca acccgtgaaa tcaaaaaact cgacggcctg     180
tgggcattca gtctggatcg cgaaaactgt ggaattgatc cagaattcgc tagcgaagtt     240
cctattccga gttcctattc tctagaaagt ataggaact tcagatccag aattcggtcc      300
gggccatcgt ggcctcttgc tcttcaggat gaagagctat gtttcgcgcc aagcttggat     360
cctagaacta gaaacgtgat gccacttgtt attgaagtcg attacagcat ctattctgtt     420
ttactattta aactttgcc atttctgact tttgaaaact atctctggat ttcggtatcg     480
ctttgtgaag atcgagcaaa agagacgttt tgtggacgca atggtccaaa tccgttctac     540
atgaacaaat tggtcacaat ttccactaaa agtaaataaa tggcaagtta aaaaggaat     600 atgcatttta ctgattgcct aggtgagctc caagagaagt tgaatctaca cgtctaccaa     660
ccgctaaaaa aagaaaaaca ttgatatgta acctgattcc attagctttt gacttcttca     720
acagattctc tacttagatt tctaacagaa atattattac tagcacatca ttttcagtct     780
cactacagca aaaaatccaa cggcacaata cagacaacag gagatatcag actcagaga      840 tagatagatg ctactgcatg tagtaagtta aataaaagga aaataaaatg tcttgctacc     900
aaaactacta cagactatga tgctcaccac aggccaaatc ctgcaactag acagcatta     960 tcttatatat attgtacaaa acaagcatca aggaacattt ggtctaggca atcagtacct    1020
cgttctacca tcaccctcag ttatcacatc cttgaaggat ccattactgg gaatcatcgg    1080
caacacatgc tcctgatggg gcacaatgac atcaagaagg taggggccag gggtgtccaa    1140
cattctctga attgccgctc taagctcttc cttcttcgtc actcgcgctg ccggtatccc    1200
acaagcatca gcaaacttga gcatgtttgg gaatatctcg ctctcgctag acggatctcc    1260
aagataggtg tgagctctat tggacttgta gaacctatcc tccaactgaa ccaccatacc    1320
caaatgctga ttgttcaaca acaatatctt aactgggaga ttctccactc ttatagtggc    1380
caactcctga acattcatga tgaaactacc atccccatca atgtcaacca acacagcccc    1440
agggttagca acagcagcac aatagccgc aggcaatcca aaacccatgg ctccaagacc    1500
ccctgaggtc aaccactgcc tcggtctctt gtacttgtaa actgcgcag cccacatttg    1560 atgctgccca accccagtac taacaatagc atctccatta gtcaactcat caagaacctc    1620
gatagcatgc tgcggagaaa tcgcgtcctg gaatgtcttg taacccaatg gaaacttgtg    1680
tttctgcaca ttaatctctt ctctccaacc tccaagatca aacttaccct ccactccttt    1740
ctcctccaaa atcatattaa ttcccttcaa ggccaacttc aaatccgcgc aaaccgacac    1800
gtgcgcctgc ttgttcttcc caatctcggc agaatcaata tcaatgtgaa caatcttagc    1860
cctactagca aaagctcaa gcttcccagt aacacggtca tcaaaccta ccccaaaggc     1920 aagcaacaaa tcactattgt caacagcata gttagcataa acagtaccat gcatacccag    1980
```

```
catctgaagg gaatattcat caccaatagg aaaagttcca agacccatta aagtgctagc    2040
aacgggaata ccagtgagtt caacaaagcg cctcaattca gcactggaat tcaaactgcc    2100
accgccgacg tagagaacgg gcttttgggc ctccatgatg agtctgacaa tgtgttccaa    2160
ttgggcctcg gcgggggggcc tgggcagcct ggcgaggtaa ccggggaggt taacgggctc    2220
gtcccaatta ggcacggcga gttgctgctg aacgtctttg gaatgtcga tgaggaccgg    2280 accggggcgg ccggaggtgg cgacgaagaa agcctcggcg acgacgcggg gatgtcgtc    2340 gacgtcgagg atgaggtagt tgtgcttcgt gatggatctg ctcacctcca cgatcggggt    2400
ttcttggaag gcgtcggtgc cgatcatccg gcgggcgacc tggccggtga tggcgacgac    2460
tgggacgctg tccattaaag cgtcggcgag gccgctcacg aggttggtgg cgccggggcc    2520
ggaggtggca atgcagacgc cggggaggcc ggaggaacgc gcgtagcctt cggcggcgaa    2580
gacgccgccc tgctcgtggc gcgggagcac gttgcggatg gcggcggagc gcgtgagcgc    2640
ctggtggatc tccatcgacg caccgccggg gtacgcgaac accgtcgtca cgccctgcct    2700
ctccagcgcc tccacaagga tgtccgcgcc cttgcgaggt tcgccggagg cgaaccgtga    2760
cacgaagggc tccgtggtcg gcgcttcctt ggtgaagggc gccgccgtgg ggggtttgga    2820
gatggaacat ttgattttga gagcgtggtt gggtttggtg agggtttgat gagagagagg    2880
gagggtggat ctagtaatgc gtttggggaa ggtggggtgt gaagaggaag aagagaatcg    2940
ggtggttctg gaagcggtgg ccgccattgt gttgtgtggc atggttatac ttcaaaaact    3000
gcacaacaag cctagagtta gtacctaaac agtaaaattta caacagagag caaagacaca    3060
tgcaaaaatt tcagccataa aaaaagttat aatagaattt aaagcaaaag tttcattttt    3120
taaacatata tacaaacaaa ctggatttga aggaagggat taattcccct gctcaaagtt    3180
tgaattccta ttgtgaccta tactcgaata aaattgaagc ctaaggaatg tatgagaaac    3240
aagaaaacaa aacaaaacta cagacaaaca agtacaatta caaaattcgc taaaattctg    3300
taatcaccaa accccatctc agtcagcaca aggcccaagg tttattttga aataaaaaaa    3360
aagtgatttt atttctcata agctaaaaga aagaaaggca attatgaaat gatttcgact    3420
agatctgaaa gtccaacgcg tattccgcag atattaaaga aagagtagag tttcacatgg    3480
atcctagatg gacccagttg aggaaaaagc aaggcaaagc aaaccagaag tgcaagatcc    3540
gaaattgaac cacggaatct aggatttggt agagggagaa gaaaagtacc ttgagaggta    3600
gaagagaaga gaagagcaga gagatatatg aacgagtgtg tcttggtctc aactctgaag    3660
cgatacgagt ttagaggga gcattgagtt ccaatttata gggaaccgg gtggcagggg    3720 tgagttaatg acggaaaagc ccctaagtaa cgagattgga ttgtgggtta gattcaaccg    3780
tttgcatccg cggcttagat tggggaagtc agagtgaatc tcaaccgttg actgagttga    3840
aaattgaatg tagcaaccaa ttgagccaac cccagccttt gccctttgat tttgatttgt    3900
ttgttgcata ctttttattt gtcttctggt tctgactctc tttctctcgt ttcaatgcca    3960
ggttgcctac tcccacacca ctcacaagaa gattctactg ttagtattaa atatttttta    4020
atgtattaaa tgatgaatgc ttttgtaaac agaacaagac tatgtctaat aagtgtcttg    4080
caacattttt taagaaatta aaaaaaatat atttattatc aaaatcaaat gtatgaaaaa    4140
tcatgaataa tataatttta tacatttttt taaaaaatct tttaatttct taattaatat    4200
cttaaaaata atgattaata tttaacccaa aataattagt atgattggta aggaagatat    4260
ccatgttatg tttggatgtg agtttgatct agagcaaagc ttactagagt cgaccgatcc    4320
```

```
gtcgacggcg cgcgcgcctc tagttgaaga cacgttcatg tcttcatcgt aagaagacac    4380
tcagtagtct tcggccagaa tggcccggac cgaagcttct gcaggaattc tgagctagcg    4440
aagttcctat tccgaagttc ctattctcta gaaagtatag gaacttcaga tccactagga    4500
tccgtcgacg g                                                         4511

<210> SEQ ID NO 3
<211> LENGTH: 5437
<212> TYPE: DNA
<213> ORGANISM: artificial sequence
<220> FEATURE:
<223> OTHER INFORMATION: plasmid PHP19340
<220> FEATURE:
<221> NAME/KEY: misc_feature
<222> LOCATION: (3914)..(3914)
<223> OTHER INFORMATION: n is a, c, g, or t

<400> SEQUENCE: 3
ggccgcgaca caagtgtgag agtactaaat aaatgctttg gttgtacgaa atcattacac      60
taaataaaat aatcaaagct tatatatgcc ttccgctaag gccgaatgca aagaaattgg     120
ttctttctcg ttatcttttg ccacttttac tagtacgtat taattactac ttaatcatct     180
ttgtttacgc tcattatat  ccgtcgacgg cgcgcccgat catccggata tagttcctcc     240
tttcagcaaa aaacccctca agacccgttt agaggcccca aggggttatg ctagttattg     300
ctcagcggtg gcagcagcca actcagcttc ctttcgggct ttgttagcag ccggatcgat     360
ccaagctgta cctcactatt cctttgccct cggacgagtg ctgggcgtc ggtttccact     420 atcggcgagt acttctacac agccatcggt ccagacggcc gcgcttctgc gggcgatttg     480
tgtacgcccg acagtcccgg ctccggatcg acgattgcg tcgcatcgac cctgcgccca     540
agctgcatca tcgaaattgc cgtcaaccaa gctctgatag agttggtcaa gaccaatgcg     600
gagcatatac gcccggagcc gcggcgatcc tgcaagctcc ggatgcctcc gctcgaagta     660
gcgcgtctgc tgctccatac aagccaacca cggcctccag aagaagatgt tggcgacctc     720
gtattgggaa tccccgaaca tcgcctcgct ccagtcaatg accgctgtta tgcggccatt     780
gtccgtcagg acattgttgg agccgaaatc cgcgtgcacg aggtgccgga cttcggggca     840
gtcctcggcc caaagcatca gctcatcgag agcctgcgcg acggacgcac tgacggtgtc     900
gtccatcaca gtttgccagt gatacacatg gggatcagca atcgcgcata tgaaatcacg     960
ccatgtagtg tattgaccga ttccttgcgg tccgaatggg ccgaacccgc tcgtctggct    1020
aagatcggcc gcagcgatcg catccatagc ctccgcgacc ggctgcagaa cagcgggcag    1080
ttcggtttca ggcaggtctt gcaacgtgac accctgtgca cggcgggaga tgcaataggt    1140
caggctctcg ctgaattccc caatgtcaag cacttccgga atcgggagcg cggccgatgc    1200
aaagtgccga taaacataac gatctttgta gaaaccatcg cgcagctat ttacccgcag    1260 gacatatcca cgccctccta catcgaagct gaaagcacga gattcttcgc cctccgagag    1320
ctgcatcagg tcggagacgc tgtcgaactt ttcgatcaga aacttctcga cagacgtcgc    1380
ggtgagttca ggcttttcca tgggtatatc tccttcttaa agttaaacaa aattatttct    1440
agagggaaac cgttgtggtc tccctatagt gagtcgtatt aatttcgcgg gatcgagatc    1500
tgatcaacct gcattaatga atcggccaac gcgcgggga aggcggtttg cgtattgggc    1560
gctcttccgc ttcctcgctc actgactcgc tgcgctcggt cgttcggctg cggcgagcgg    1620
tatcagctca ctcaaaggcg gtaatacggt tatccacaga atcaggggat aacgcaggaa    1680
agaacatgtg agcaaaaggc cagcaaaagg ccaggaaccg taaaaaggcc gcgttgctgg    1740
```

```
cgttttcca taggctccgc cccctgacg agcatcacaa aaatcgacgc tcaagtcaga    1800
ggtggcgaaa cccgacagga ctataaagat accaggcgtt tccccctgga agctccctcg    1860
tgcgctctcc tgttccgacc ctgccgctta ccggatacct gtccgccttt ctcccttcgg    1920
gaagcgtggc gctttctcaa tgctcacgct gtaggtatct cagttcggtg taggtcgttc    1980
gctccaagct gggctgtgtg cacgaacccc cgttcagccc gaccgctgc gccttatccg    2040 gtaactatcg tcttgagtcc aacccggtaa gacacgactt atcgccactg gcagcagcca    2100
ctggtaacag gattagcaga gcgaggtatg taggcggtgc tacagagttc ttgaagtggt    2160
ggcctaacta cggctacact agaaggacag tatttggtat ctgcgctctg ctgaagccag    2220
ttaccttcgg aaaaagagtt ggtagctctt gatccggcaa acaaaccacc gctggtagcg    2280
gtggtttttt tgtttgcaag cagcagatta cgcgcagaaa aaaggatctc aagaagatc    2340 ctttgatctt ttctacgggg tctgacgctc agtggaacga aaactcacgt taagggattt    2400
tggtcatgac attaacctat aaaaataggc gtatcacgag gcccttttcgt ctcgcgcgtt    2460 tcggtgatga cggtgaaaac ctctgacaca tgcagctccc ggagacggtc acagcttgtc    2520
tgtaagcgga tgccgggagc agacaagccc gtcaggcgc gtcagcgggt gttggcgggt    2580 gtcgggctg gcttaactat gcggcatcag agcagattgt actgagagtg caccatatgg    2640
acatattgtc gttagaacgc ggctacaatt aatacataac cttatgtatc atacacatac    2700
gatttaggtg acactataga acggcgcgcc aagcttggat cctcgaagag aagggttaat    2760 aacacattt ttaacatttt taacacaaat tttagttatt taaaaattta ttaaaaaatt    2820
taaaataaga agaggaactc tttaaataaa tctaacttac aaaatttatg atttttaata    2880
agttttcacc aataaaaat gtcataaaaa tatgttaaaa agtatattat caatattctc    2940
tttatgataa ataaaagaa aaaaaaaata aagttaagt gaaaatgaga ttgaagtgac    3000
tttaggtgtg tataaatata tcaaccccgc caacaattta tttaatccaa atatattgaa    3060
gtatattatt ccatagcctt tatttattta tatatttatt atataaaagc tttatttgtt    3120
ctaggttgtt catgaaatat tttttggtt ttatctccgt tgtaagaaaa tcatgtgctt    3180
tgtgtcgcca ctcactattg cagctttttc atgcattggt cagattgacg gttgattgta    3240
ttttgttttt ttatggtttt gtgttatgac ttaagtcttc atctctttat ctcttcatca    3300
ggtttgatgg ttacctaata tggtccatgg gtacatgcat ggttaaatta ggtggccaac    3360
tttgttgtga acgatagaat tttttttata ttaagtaaac tatttttata ttatgaaata    3420
ataataaaaa aaatattta tcattattaa caaaatcata ttagtaatt tgttaactct    3480 ataataaaag aaatactgta acattcacat tacatggtaa catctttcca ccctttcatt    3540 tgtttttgt ttgatgactt ttttcttgt ttaaatttat ttcccttctt ttaaatttgg    3600
aatacattat catcatatat aaactaaaat actaaaaaca ggattacaca aatgataaat    3660
aataacacaa atatttataa atctagctgc aatatattta aactagctat atcgatattg    3720
taaaataaaa ctagctgcat tgatactgat aaaaaaatat catgtgcttt ctggactgat    3780
gatgcagtat acttttgaca ttgcctttat tttatttttc agaaaagctt tcttagttct    3840
gggttcttca ttatttgttt cccatctcca ttgtgaattg aatcatttgc ttcgtgtcac    3900
aaatacaatt tagntaggta catgcattgg tcagattcac ggtttattat gtcatgactt    3960
aagttcatgg tagtacatta cctgccacgc atgcattata ttggttagat ttgataggca    4020
aatttggttg tcaacaatat aaatataaat aatgttttta tattacgaaa taacagtgat    4080
```

```
caaaacaaac agttttatct ttattaacaa gattttgttt ttgtttgatg acgttttta       4140
atgtttacgc tttcccccctt cttttgaatt tagaacactt tatcatcata aaatcaaata       4200
ctaaaaaaat tacatatttc ataaataata acacaaatat ttttaaaaaa tctgaaataa       4260
taatgaacaa tattacatat tatcacgaaa attcattaat aaaaatatta tataaataaa       4320
atgtaatagt agttatatgt aggaaaaaag tactgcacgc ataatatata caaaaagatt       4380
aaaatgaact attataaata ataacactaa attaatggtg aatcatatca aaataatgaa       4440
aaagtaaata aaatttgtaa ttaacttcta tatgtattac acacacaaat aataaataat       4500
agtaaaaaaa attatgataa atatttacca tctcataaga tatttaaaat aatgataaaa       4560
atatagatta ttttttatgc aactagctag ccaaaaagag aacacgggta tatataaaaa       4620
gagtaccttt aaattctact gtacttcctt tattcctgac gttttttatat caagtggaca       4680
tacgtgaaga ttttaattat cagtctaaat atttcattag cacttaatac ttttctgttt       4740
tattcctatc ctataagtag tcccgattct cccaacattg cttattcaca caactaacta       4800
agaaagtctt ccatagcccc ccaagcggcc gctgagtgat tgctcacgag tgtggtcacc       4860
atgccttcag caagtaccaa tgggttgatg atgttgtggg tttgacccctt cactcaacac       4920
ttttagtccc ttatttctca tggaaaataa gccatcgccg ccatcactcc aacacaggtt       4980
cccttgaccg tgatgaagtg tttgtcccaa aaccaaaatc caagttgca tggttttcca       5040
agtacttaaa caaccctcta ggaagggctg tttctcttct cgtcacactc acaatagggt       5100
ggcctatgta tttagccttc aatgtctctg gtagacccta tgatagtttt gcaagccact       5160
accacccta tgctcccata tattctaacc gtgagaggct tctgatctat gtctctgatg       5220
ttgctttgtt ttctgtgact tactctctct accgtgttgc aaccctgaaa gggttggttt       5280
ggctgctatg tgtttatggg gtgcctttgc tcattgtgaa cggttttctt gtgactatca       5340
catatttgca gcacacacac tttgccttgc ctcattacga ttcatcagaa tgggactggc       5400
tgaagggagc tttggcaact atggacagag attaagc                                5437

<210> SEQ ID NO 4
<211> LENGTH: 7025
<212> TYPE: DNA
<213> ORGANISM: artificial sequence
<220> FEATURE:
<223> OTHER INFORMATION: plasmid PHP17752

<400> SEQUENCE: 4
gatccgtcga cggcgcgccc gatcatccgg atatagttcc tcctttcagc aaaaaacccc         60
tcaagacccg tttagaggcc ccaagggggtt atgctagtta ttgctcagcg gtggcagcag        120
ccaactcagc ttccttttcgg gctttgttag cagccggatc gatccaagct gtacctcact        180
attcctttgc cctcggacga gtgctggggc gtcggtttcc actatcggcg agtacttcta        240
cacagccatc ggtccagacg gccgcgcttc tgcgggcgat tgtgtacgc ccgacagtcc         300
cggctccgga tcggacgatt gcgtcgcatc gaccctgcgc ccaagctgca tcatcgaaat        360
tgccgtcaac caagctctga tagagttggt caagaccaat gcggagcata tacgcccgga        420
gccgcggcga tcctgcaagc tccggatgcc tccgctcgaa gtagcgcgtc tgctgctcca        480
tacaagccaa ccacggcctc cagaagaaga tgttggcgac ctcgtattgg gaatccccga        540
acatcgcctc gctccagtca atgaccgctg ttatgcggcc attgtccgtc aggacattgt        600
tggagccgaa atccgcgtgc acgaggtgcc ggacttcggg gcagtcctcg gcccaaagca        660
tcagctcatc gagagcctgc gcgacggacg cactgacggt gtcgtccatc acagtttgcc        720
```

```
agtgatacac atggggatca gcaatcgcgc atatgaaatc acgccatgta gtgtattgac      780
cgattccttg cggtccgaat gggccgaacc cgctcgtctg gctaagatcg gccgcagcga      840
tcgcatccat agcctccgcg accggctgca gaacagcggg cagttcggtt tcaggcaggt      900
cttgcaacgt gacaccctgt gcacggcggg agatgcaata ggtcaggctc tcgctgaatt      960
ccccaatgtc aagcacttcc ggaatcggga gcgcggccga tgcaaagtgc cgataaacat     1020
aacgatcttt gtagaaacca tcggcgcagc tatttacccg caggacatat ccacgccctc     1080
ctacatcgaa gctgaaagca cgagattctt cgccctccga gagctgcatc aggtcggaga     1140
cgctgtcgaa cttttcgatc agaaacttct cgacagacgt cgcggtgagt tcaggctttt     1200
ccatgggtat atctccttct taaagttaaa caaaattatt tctagaggga aaccgttgtg     1260
gtctccctat agtgagtcgt attaatttcg cgggatcgag atctgatcaa cctgcattaa     1320
tgaatcggcc aacgcgcggg gagaggcggt ttgcgtattg ggcgctcttc cgcttcctcg     1380
ctcactgact cgctgcgctc ggtcgttcgg ctgcggcgag cggtatcagc tcactcaaag     1440
gcggtaatac ggttatccac agaatcaggg gataacgcag gaaagaacat gtgagcaaaa     1500
ggccagcaaa aggccaggaa ccgtaaaaag gccgcgttgc tggcgttttt ccataggctc     1560
cgccccctg acgagcatca caaaaatcga cgctcaagtc agaggtggcg aaacccgaca     1620
ggactataaa gataccaggc gtttccccct ggaagctccc tcgtgcgctc tcctgttccg     1680
accctgccgc ttaccggata cctgtccgcc tttctccctt cgggaagcgt ggcgctttct     1740
caatgctcac gctgtaggta tctcagttcg gtgtaggtcg ttcgctccaa gctgggctgt     1800
gtgcacgaac cccccgttca gcccgaccgc tgcgccttat ccggtaacta tcgtcttgag     1860
tccaacccgg taagacacga cttatcgcca ctggcagcag ccactggtaa caggattagc     1920
agagcgaggt atgtaggcgg tgctacagag ttcttgaagt ggtggcctaa ctacggctac     1980
actagaagga cagtatttgg tatctgcgct ctgctgaagc cagttacctt cggaaaaaga     2040
gttggtagct cttgatccgg caaacaaacc accgctggta gcggtggttt ttttgtttgc     2100
aagcagcaga ttacgcgcag aaaaaaagga tctcaagaag atcctttgat cttttctacg     2160
gggtctgacg ctcagtggaa cgaaaactca cgttaaggga ttttggtcat gacattaacc     2220
tataaaaata ggcgtatcac gaggcccttt cgtctcgcgc gtttcggtga tgacggtgaa     2280
aacctctgac acatgcagct cccggagacg gtcacagctt gtctgtaagc ggatgccggg     2340
agcagacaag cccgtcaggg cgcgtcagcg ggtgttggcg ggtgtcgggg ctggcttaac     2400
tatgcggcat cagagcagat tgtactgaga gtgcaccata tggacatatt gtcgttagaa     2460
cgcggctaca attaatacat aaccttatgt atcatacaca tacgatttag gtgacactat     2520
agaacggcgc gccaagcttg atccccccct cgaggtcgac ggtatcgata agcttctgca     2580
ggaattctga gctagcgaag ttcctattcc gaagttccta ttcttcaaaa agtataggaa     2640
cttcagacgt cctcgagtcc gtcctgtaga accccaacc cgtgaaatca aaaaactcga     2700
cggcctgtgg gcattcagtc tggatcgcga aaactgtgga attgatccag aattcgctag     2760
cgaagttcct attccgaagt tcctattctc tagaaagtat aggaacttca gatccagaat     2820
tcggtccggg ccatcgtggc ctcttgctct tcaggatgaa gagctatgtt tcgcgccaag     2880
cttggatcct agaactagaa acgtgatgcc acttgttatt gaagtcgatt acagcatcta     2940
ttctgtttta ctatttataa ctttgccatt tctgactttt gaaaactatc tctggatttc     3000
ggtatcgctt tgtgaagatc gagcaaaaga gacgttttgt ggacgcaatg gtccaaatcc     3060
```

```
gttctacatg aacaaattgg tcacaatttc cactaaaagt aaataaatgg caagttaaaa      3120
aaggaatatg cattttactg attgcctagg tgagctccaa gagaagttga atctacacgt      3180
ctaccaaccg ctaaaaaaag aaaaacattg atatgtaacc tgattccatt agcttttgac      3240
ttcttcaaca gattctctac ttagatttct aacagaaata ttattactag cacatcattt      3300
tcagtctcac tacagcaaaa aatccaacgg cacaatacag acaacaggag atatcagact      3360
acagagatag atagatgcta ctgcatgtag taagttaaat aaaaggaaaa taaaatgtct      3420
tgctaccaaa actactacag actatgatgc tcaccacagg ccaaatcctg caactaggac      3480
agcattatct tatatatatt gtacaaaaca agcatcaagg aacatttggt ctaggcaatc      3540
agtacctcgt tctaccatca ccctcagtta tcacatcctt gaaggatcca ttactgggaa      3600
tcatcggcaa cacatgctcc tgatgggggca caatgacatc aagaaggtag gggcaggggg      3660
tgtccaacat tctctgaatt gccgctctaa gctcttcctt cttcgtcact cgcgctgccg      3720
gtatcccaca agcatcagca aacttgagca tgtttgggaa tatctcgctc tcgctagacg      3780
gatctccaag ataggtgtga gctctattgg acttgtagaa cctatcctcc aactgaacca      3840
ccatacccaa atgctgattg ttcaacaaca atatcttaac tgggagattc tccactctta      3900
tagtggccaa ctcctgaaca ttcatgatga aactaccatc cccatcaatg tcaaccacaa      3960
cagccccagg gttagcaaca gcagcaccaa tagccgcagg caatccaaaa cccatggctc      4020 caagacccccc tgaggtcaac cactgcctcg gtctcttgta cttgtaaaac tgcgcagccc      4080
acatttgatg ctgcccaacc ccagtactaa caatagcatc tccattagtc aactcatcaa      4140
gaacctcgat agcatgctgc ggagaaatcg cgtcctggaa tgtcttgtaa cccaatggaa      4200
acttgtgttt ctgcacatta atctcttctc tccaacctcc aagatcaaac ttaccctcca      4260
ctcctttctc ctccaaaatc atattaattc ccttcaaggc caacttcaaa tccgcgcaaa      4320
ccgacacgtg cgcctgcttg ttcttcccaa tctcggcaga atcaatatca atgtgaacaa      4380
tcttagccct actagcaaaa gcctcaagct tcccagtaac acggtcatca aaccttaccc      4440
caaaggcaag caacaaatca ctattgtcaa cagcatagtt agcataaaca gtaccatgca      4500
tacccagcat ctgaagggaa tattcatcac caataggaaa agttccaaga cccattaaag      4560
tgctagcaac gggaatacca gtgagttcaa caaagcgcct caattcagca ctggaattca      4620
aactgccacc gccgacgtag agaacgggct tttgggcctc catgatgagt ctgacaatgt      4680
gttccaattg ggcctcggcg gggggcctgg gcagcctggc gaggtaaccg gggaggttaa      4740
cgggctcgtc ccaattaggc acggcgagtt gctgctgaac gtctttggga atgtcgatga      4800
ggaccggacc ggggcggccg gaggtggcga cgaagaaagc ctcggcgacg acgcggggga      4860
tgtcgtcgac gtcgaggatg aggtagttgt gcttcgtgat ggatctgctc acctccacga      4920
tcggggtttc ttggaaggcg tcggtgccga tcatccggcg ggcgacctgg ccggtgatgg      4980
cgacgactgg gacgctgtcc attaaagcgt cggcgaggcc gctcacgagg ttggtggcgc      5040
cggggccgga ggtggcaatg cagacgccgg ggaggccgga ggaacgcgcg tagccttcgg      5100
cggcgaagac gccgccctgc tcgtggcgcg ggagcacgtt gcggatggcg gcggagcgcg      5160
tgagcgcctg gtggatctcc atcgacgcac cgccggggta cgcgaacacc gtcgtcacgc      5220
cctgcctctc cagcgcctcc acaaggatgt ccgcgccctt gcgaggttcg ccggaggcga      5280
accgtgacac gaagggctcc gtggtcggcg cttccttggt gaaggcgcc gccgtggggg      5340 gtttggagat ggaacatttg attttgagag cgtggttggg tttggtgagg gtttgatgag      5400
agagagggag ggtggatcta gtaatgcgtt tggggaaggt ggggtgtgaa gaggaagaag      5460
```

```
agaatcgggt ggttctggaa gcggtggccg ccattgtgtt gtgtggcatg gttatacttc   5520
aaaaactgca caacaagcct agagttagta cctaaacagt aaatttacaa cagagagcaa   5580
agacacatgc aaaaatttca gccataaaaa aagttataat agaatttaaa gcaaaagttt   5640
cattttttaa acatatatac aaacaaactg gatttgaagg aagggattaa ttcccctgct   5700
caaagtttga attcctattg tgacctatac tcgaataaaa ttgaagccta aggaatgtat   5760
gagaaacaag aaaacaaaac aaaactacag acaaacaagt acaattacaa aattcgctaa   5820
aattctgtaa tcaccaaacc ccatctcagt cagcacaagg cccaaggttt attttgaaat   5880
aaaaaaaaag tgattttatt tctcataagc taaaagaaag aaaggcaatt atgaaatgat   5940
ttcgactaga tctgaaagtc caacgcgtat tccgcagata ttaagaaag agtagagttt   6000 cacatggatc ctagatggac ccagttgagg aaaaagcaag gcaaagcaaa ccagaagtgc   6060
aagatccgaa attgaaccac ggaatctagg atttggtaga gggagaagaa aagtaccttg   6120
agaggtagaa gagaagagaa gagcagagag atatatgaac gagtgtgtct tggtctcaac   6180
tctgaagcga tacgagttta gaggggagca ttgagttcca atttataggg aaaccgggtg   6240
gcaggggtga gttaatgacg gaaaagcccc taagtaacga gattggattg tgggttagat   6300
tcaaccgttt gcatccgcgg cttagattgg ggaagtcaga gtgaatctca accgttgact   6360
gagttgaaaa ttgaatgtag caaccaattg agccaacccc agcctttgcc ctttgatttt   6420
gatttgtttg ttgcatactt tttatttgtc ttctggttct gactctcttt ctctcgtttc   6480
aatgccaggt tgcctactcc cacaccactc acaagaagat tctactgtta gtattaaata   6540
ttttttaatg tattaaatga tgaatgcttt tgtaaacaga acaagactat gtctaataag   6600
tgtcttgcaa cattttttaa gaaattaaaa aaaatatatt tattatcaaa atcaaatgta   6660
tgaaaaatca tgaataatat aattttatac atttttttaa aaaatctttt aatttcttaa   6720
ttaatatctt aaaaataatg attaatattt aacccaaaat aattagtatg attggtaagg   6780
aagatatcca tgttatgttt ggatgtgagt ttgatctaga gcaaagctta ctagagtcga   6840
ccgatccgtc gacggcgcgc gcgcctctag ttgaagacac gttcatgtct tcatcgtaag   6900
aagacactca gtagtcttcg gccagaatgg cccggaccga agcttctgca ggaattctga   6960
gctagcgaag ttcctattcc gaagttccta ttctctagaa agtataggaa cttcagatcc   7020
actag                                                                7025
```